United States Patent
Majhi et al.

(10) Patent No.: US 12,268,011 B2
(45) Date of Patent: Apr. 1, 2025

(54) PILLAR SELECT TRANSISTOR FOR 3-DIMENSIONAL CROSS POINT MEMORY

(71) Applicant: Intel Corporation, Santa Clara, CA (US)

(72) Inventors: Prashant Majhi, San Jose, CA (US); Derchang Kau, Cupertino, CA (US); Max Hineman, Boise, ID (US)

(73) Assignee: Intel Corporation, Santa Clara, CA (US)

(*) Notice: Subject to any disclaimer, the term of this patent is extended or adjusted under 35 U.S.C. 154(b) by 866 days.

(21) Appl. No.: 17/118,385

(22) Filed: Dec. 10, 2020

(65) Prior Publication Data

US 2022/0190030 A1    Jun. 16, 2022

(51) Int. Cl.

| | | |
|---|---|---|
| H01L 27/00 | (2006.01) | |
| G11C 5/06 | (2006.01) | |
| G11C 13/00 | (2006.01) | |
| H01L 27/06 | (2006.01) | |
| H10B 63/00 | (2023.01) | |
| H10N 70/00 | (2023.01) | |
| H10N 70/20 | (2023.01) | |

(52) U.S. Cl.
CPC ............ *H10B 63/845* (2023.02); *G11C 5/06* (2013.01); *G11C 13/0002* (2013.01); *H01L 27/0688* (2013.01); *H10N 70/021* (2023.02); *H10N 70/253* (2023.02); *H10N 70/883* (2023.02)

(58) Field of Classification Search
CPC .. H10B 63/845; H10N 70/883; H10N 70/021; H10N 70/253; G11C 5/06; G11C 13/0002; H01L 27/0688
See application file for complete search history.

(56) References Cited

U.S. PATENT DOCUMENTS

| | | | |
|---|---|---|---|
| 2017/0025475 A1 | 1/2017 | Takagi et al. | |
| 2019/0051703 A1 | 2/2019 | Sel et al. | |
| 2019/0067475 A1* | 2/2019 | Liu | H10B 43/40 |
| 2019/0115071 A1 | 4/2019 | Nardi et al. | |
| 2021/0399013 A1* | 12/2021 | Wu | H10B 51/20 |

OTHER PUBLICATIONS

Extended European Search Report for European Patent Application No. 21197090.0, dated Mar. 21, 2022.
Notice of Allowance from European Patent Application No. 21197090.0 notified Dec. 6, 2024, 6 pgs.

* cited by examiner

*Primary Examiner* — Richard A Booth
(74) *Attorney, Agent, or Firm* — Essential Patents Group, LLP

(57) ABSTRACT

A memory device structure includes a vertical transistor having a channel between a source and a drain, a gate electrode adjacent the channel, where the gate electrode is in a first direction orthogonal to a longitudinal axis of the channel. A gate dielectric layer is between the gate electrode and the channel A first terminal of a first interconnect is coupled with the source or the drain, where the first interconnect is colinear with the longitudinal axis. The memory device structure further includes a pair of memory cells, where individual ones of the memory cells includes a selector and a memory element, where a first terminal of the individual ones of the memory cell is coupled to a respective second and a third terminal of the first interconnect. A second terminal of the individual ones of the memory cell is coupled to individual ones of the pair of second interconnects.

20 Claims, 17 Drawing Sheets

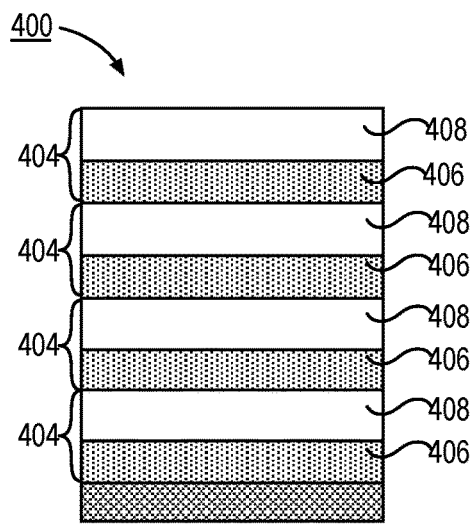
FIG. 4A
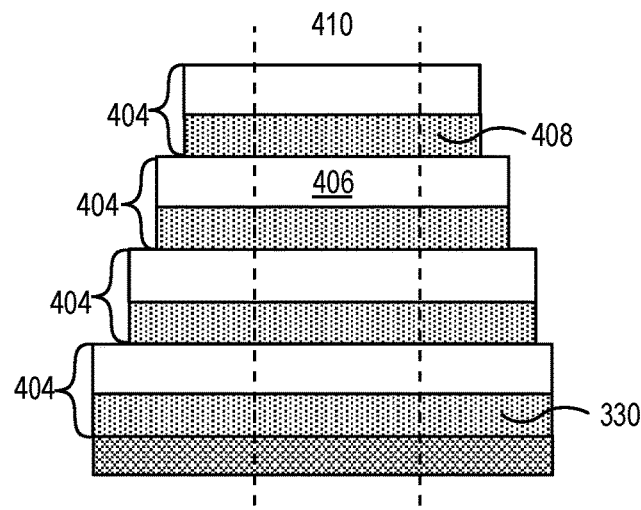
FIG. 4B
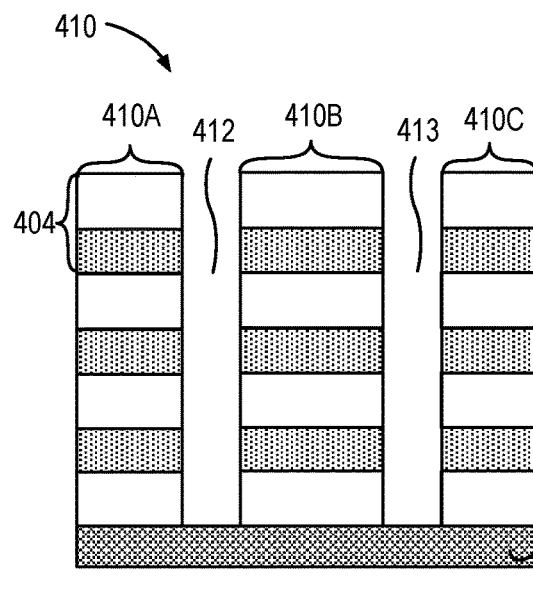
FIG. 4C
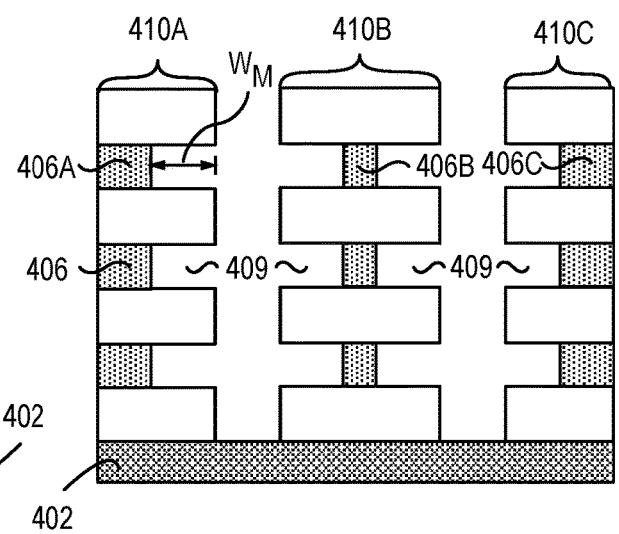
FIG. 4D
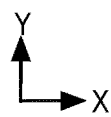

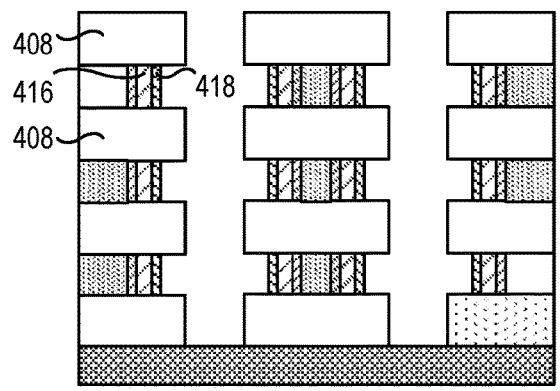
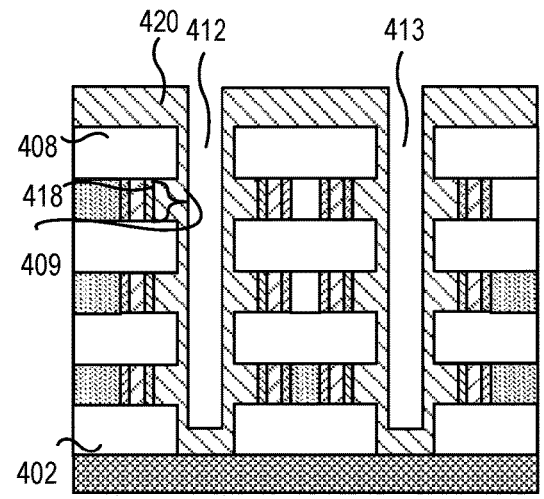
FIG. 4I
FIG. 4J
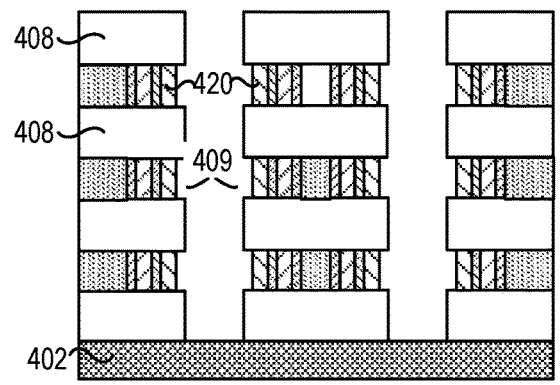
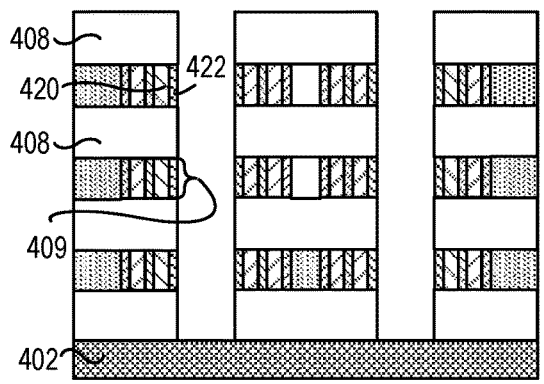
FIG. 4K
FIG. 4L
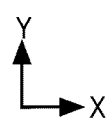

PILLAR SELECT TRANSISTOR FOR 3-DIMENSIONAL CROSS POINT MEMORY

BACKGROUND

A three-dimensional (3-D) cross point memory array may have tiers, or decks, of memory cells. However, increasing a total number of memory cells in this manner may proportionately increase the number of decoder transistors needed, thereby increasing an overall footprint of the decoder transistors. As such, solutions are required to increase memory density while minimizing decoder transistor footprint.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 4A illustrates a material layer stack formed above a substrate.

FIG. 4B is a cross-sectional illustration of the structure in FIG. 4A following the process to mask and etch to form a staircase structure.

FIG. 4C is a cross-sectional illustration of a portion of the material layer stack in FIG. 4B, following the process to etch and form plurality of openings.

FIG. 4D illustrates the structure of FIG. 4C following a process to selectively laterally recess portions of a dielectric to form a plurality of recesses.

FIG. 4I illustrates the structure of FIG. 4H following the formation of electrode material adjacent to the selector material.

FIG. 4J illustrates the structure of FIG. 4I following the deposition of one or more layers of memory material in the plurality of recesses adjacent to the electrode material.

FIG. 4K illustrates the structure of FIG. 4J following the process to etch and remove portions of the memory material and from portions of lateral recesses adjacent to electrode material.

FIG. 4L illustrates the structure of FIG. 4K following the formation of electrode material adjacent to the memory material.

DESCRIPTION OF THE EMBODIMENTS

Figure 1A:
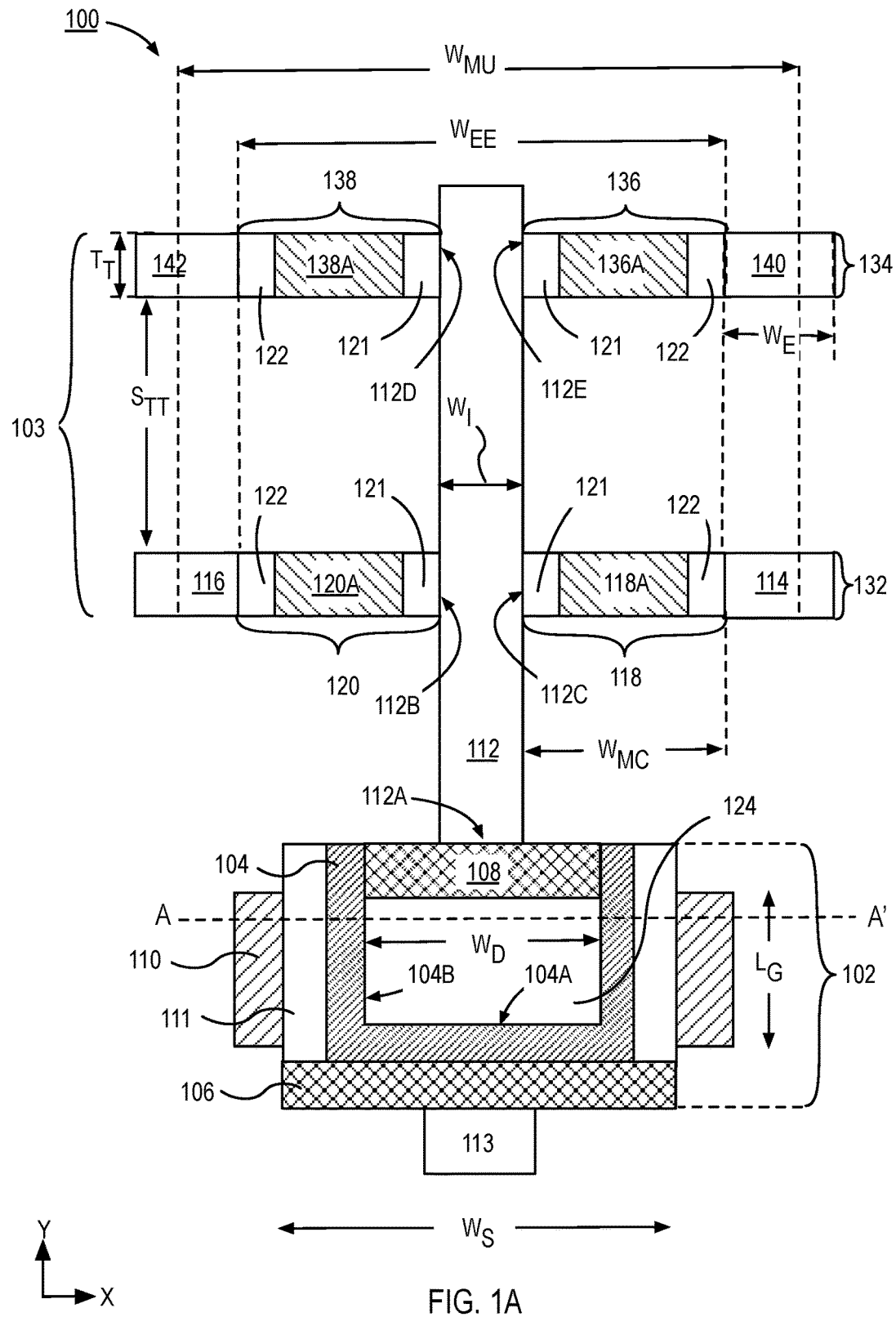
FIG. 1A is a cross-sectional illustration of a memory device structure including a vertical transistor coupled with a tiered memory array.

Pillar select transistors for 3-D cross point and methods of fabrication are described below. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as operations associated with field effect transistors (FETs) and memory or selector elements, are described in lesser detail to not obscure embodiments of the present disclosure. Furthermore, the various embodiments shown in the Figures are illustrative representations but are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being laterally next to (e.g., immediately next to with one or more things between them) or adjoining another thing (e.g., abutting it).

The term "signal" may refer to at least one current signal, voltage signal, magnetic signal, or data/clock signal. The meaning of "a," "an," and "the" include plural references.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Memory cells are used in conjunction with large arrays of decoder transistors for a variety of 3-D cross point memory applications. A 3-D cross point memory array often includes a series of word lines on a first plane and series of bit lines on a second plane above the first plane, where the word lines orthogonally cross over the bit lines (or vice versa). A memory cell is located at each point of cross over (cross-point) between the word line and the bit line, where the memory cell couples a word line with a corresponding bit line to form a single memory array deck, or herein deck.

In embodiments, an effective cell size of a cross point memory cell is equal to a cell pitch squared divided by a number of decks. In some embodiments, a number of memory decks is approximately 6 or less. Memory scaling may be limited by a certain memory pitch (lateral spacing between memory cells) when an upper limit for the number of memory decks is reached. Memory density may be increased in conventional 3-D cross point memory by pitch scaling and stacking layers (increasing number of decks). However, production cost may increase significantly with more decks as a function of the number of process operations needed to fabricate each deck.

However, the inventors have devised an arrangement that can increase the number of stacks in a memory device structure without concomitantly increasing memory device production costs. In accordance with an embodiment of the present disclosure, the memory device structure includes memory cells where a memory element is laterally coupled with a selector element in each memory cell. In further embodiments, the memory device structure may include a plurality of memory cells in an array extending in two orthogonal directions on a plane to form a tier, or deck. The memory device structure may include a plurality of decks that are stacked. During operation, the memory device structure may permit the selection of a unique set of word line, bitline and tier/deck address to access a pair of memory cells.

The memory device structures described herein may advantageously reduce a number of decoder or programming transistors, providing a reduction in chip area. A decoder transistor may be individually coupled with each word line and a bit line to address a particular memory cell in a tier. When the number of memory cells are increased, the number of bit lines and word lines increase in proportion as does the number of decoder transistors required to address each memory cell (bit cell). To accommodate a larger number of decoder transistors in a vicinity of a cross point array, such as, for example below the cross-point memory array, relative lengths of a word line and bit line may be increased. Alternatively, decoder transistors may occupy a region laterally adjacent to the memory array. In either example a larger chip area may be utilized. Increasing number of layers (tiers) of memory cells to form a 3-dimensional array can increase memory density per unit area. However, increasing the number of memory cells also proportionately increases the number of decoder transistors required. In some examples a single tier may include 4K bit lines and 4K word lines. Thus, a single 4K by 4K tier can require 8K decoder transistors. Because the number of decoder transistors increases proportionally with the number of tiers, enabling a high-density memory array for a given die size can be highly challenging.

In accordance with some embodiments, multiple (e.g., two) memory cells in a tier are coupled through a common electrode to reduce the number of decoder transistors. The common electrode may be further coupled to a source or a drain of a decoder transistor directly below. In addition to coupling multiple memory cells by a common electrode to reduce the total number of decoder transistors, confining the decoder transistors to within a footprint of a memory cell is also advantageous for reducing device footprint.

Another advantage of the memory device structures in accordance with embodiments is that memory cells in various tiers may be concurrently fabricated, which may significantly reduce fabrication costs per memory cell.

FIG. 1A is a cross sectional illustration of a memory device structure 100 including a vertical pillar select transistor 102 coupled with a tiered memory structure 103. As shown, pillar select transistor 102 includes a channel layer 104 between a source structure 106 and a drain structure 108. As shown, the channel layer 104 is directed along a longitudinal axis of the pillar select transistor 102 (along y-axis in Figure). The pillar select transistor 102 also includes a gate electrode 110 adjacent to the channel layer 104. The gate electrode 110 has a length in a direction orthogonal to longitudinal axis (along x-axis). A gate dielectric layer 111 is between the gate electrode 110 and the channel layer 104. The memory device structure 100 further includes an interconnect 112, where the interconnect 112 is colinear with the longitudinal axis of pillar select transistor 102. In the illustrative embodiment, terminal 112A of the interconnect 112 is coupled with the drain structure 108. In an exemplary embodiment, interconnect 112 is coupled to an interconnect 113 through the pillar select transistor 102. interconnect 113 is representative of a bit line in memory device structure 100. In the illustrative embodiment, interconnect 113 is below and coupled to the source structure 106.

As shown, pillar select transistor 102 is a thin film transistor. In the illustrative embodiment, the channel layer 104 includes a horizontal channel portion 104A and vertical channel portions 104B. Horizontal portion 104A is adjacent to source structure 106 and vertical portions 104B are adjacent to gate dielectric layer 111. The channel layer 104 may laterally overlap with drain structure 108. In the illustrative embodiment, vertical channel portions 104B laterally confines drain structure 108. In other embodiments, vertical channel portions 104B is under drain structure 108. The channel layer 104 is also adjacent to a dielectric 124. Dielectric 124 has a vertical thickness along the longitudinal axis that modulates a gate length, $L_G$, of the pillar select transistor 102. An electrical gate length of pillar select transistor 102 is determined by a thickness of the gate electrode 110 along the longitudinal axis. In an embodiment, $L_G$, is between 50 nm and 500 nm. A desired $L_G$ further depends on a maximum operating voltage of the pillar select transistor 102.

In the cross-sectional illustration, the gate electrode 110 is spatially distant, along the longitudinal axis (e.g., y-axis) from source structure 106. However, gate electrode 110 may overlap drain structure 108 along the longitudinal axis. In some embodiments, gate electrode 110 may laterally overlap drain structure 108 with an intervening dielectric 111 between the channel layer 104 and gate electrode 110.

Figure 1B:
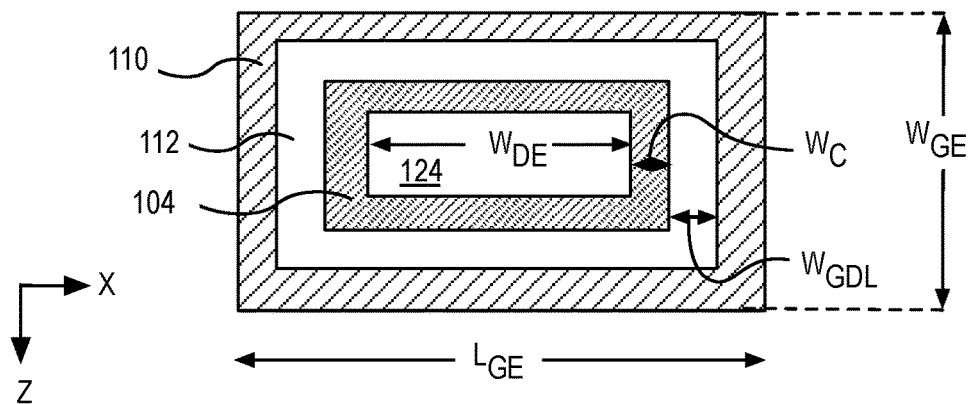
FIG. 1B is a plan-view illustration of a line segment through midplane of the transistor in FIG. 1A.

FIG. 1B is a plan view illustration through a line A-A' in FIG. 1A. As shown, various layers in pillar select transistor 102 are substantially conformal cladding layers around the dielectric 124. As shown, channel layer 104 clads dielectric 124, gate dielectric layer 111 clads channel layer 104 and the gate electrode 110 clads the gate dielectric layer 111. Dielectric 124 has a lateral thickness $W_{DE}$, that is substantially greater than lateral thicknesses, $W_C$ of the channel layer 104 and lateral thickness, $W_{GDL}$, of gate dielectric layer 111. In embodiments, channel layer 104 has a lateral thickness $W_C$ that is between 5 nm and 20 nm. In some embodiments, the gate dielectric layer 111 has a lateral thickness $W_G$ that is between 1 nm and 3 nm.

The gate electrode 110 has a length, $L_{GE}$, in a direction orthogonal to the longitudinal axis of the channel layer 104. $L_{GE}$ is distinct from $L_G$, or transistor gate length illustrated in FIG. 1A. The gate electrode 110 has a width, $W_{GE}$. $W_{GE}$ is measured along the z-axis in a direction along the interconnect 114 or 116 (not shown in the Figure). In an exemplary embodiment, $W_{GE}$ is less than 150 nm.

Referring again to FIG. 1A, drain structure 108 has a lateral thickness, $W_D$, and source structure 106 has a lateral thickness, $W_S$, along the x-axis. In the illustrative embodiment, $W_D$ is less than $W_S$. In the illustrative embodiment, the source structure 106 has a lateral thickness that is equal to combined sum of lateral thicknesses of the drain structure 108, twice a lateral thickness of the gate dielectric layer 111 and twice a lateral thickness of the channel layer 104.

The transistor 102 is coupled with tiered memory structure 103 through interconnect 112. The tiered memory structure 103 includes a plurality of tiers. In the illustrative embodiment, two tiers are shown, for example a tier 132 and a tier 134 directly above tier 132. As shown, tier 132 includes a pair of memory cells 118 and 120 and a pair of interconnects such as interconnect 114 and interconnect 116 that extend orthogonal to the interconnect 112 (e.g., z-axis). Interconnects 116 and 114 are examples of word lines of the memory device structure 100. As shown, each memory cell 118 and 120 is symmetrically coupled to a portion of the interconnect 112 laterally between respective interconnects 114 and 116.

In the illustrative embodiment, each of the memory cells 118 and 120 include a terminal 121 and a terminal 122 at an opposite end of terminal 121. One of the terminals 121 or 122 of each memory cell is coupled to the transistor 102 (through the interconnect 112) and a second of the terminals 121 or 122 is coupled with either interconnect 114 or 116. As shown terminal 121 of each memory cell is coupled to interconnect 112 and terminal 122 of each memory cell is coupled to interconnect 114 or interconnect 116. In the illustrative embodiment, terminal 121 of each memory cell 118 and 120 is coupled to a terminal 112B and 112C, respectively, of interconnect 112, within tier 132. Also as shown, a terminal 122 of memory cell 118 is coupled with an interconnect 114 and terminal 122 of memory cell 120 is coupled with an interconnect 116.

In the illustrative embodiment, the tiered memory structure 103 further includes an additional pair of memory cells 136 and 138 that are symmetrically coupled to a portion of the interconnect 112 within tier 134. In exemplary embodiments, memory cells 136 and 138 are directly above memory cells 118 and 120, respectively. Tier 134 further includes a pair of interconnects, such as interconnect 140 and interconnect 142 that are above and parallel to interconnects 114 and 116, respectively. Interconnects 140 and 142 are examples of word lines of memory device structure 100. In the illustrative embodiment, a terminal 121 of each memory cell 136 and 138 is coupled to a terminal 112D and 112E, respectively of interconnect 112. As shown, a terminal 122 of memory cell 136 is coupled with interconnect 140 and terminal 122 of memory cell 138 is coupled with interconnect 142.

It is to be appreciated that interconnects 114, 116, 140 and 142 can be independently voltage biased to program any of the four memory cells 118, 120, 136 or 138 in memory device structure 100.

Tier 134 is spaced apart from tier 132 along the longitudinal axis of the channel layer 104, (e.g., y-axis), by a distance, $S_{TT}$. In embodiments, $S_{TT}$ is between 5 nm and 30 nm. Tier 132 and tier 134 each have a vertical thickness, $T_T$, measured along the longitudinal axis of the channel layer 104. In embodiments $T_T$ is between 5 nm and 20 nm.

As shown, interconnect structure 112 has a lateral thickness, $W_I$, where $W_I$, is measured along the x-direction. As shown, each memory cell 118 and 120 has a lateral thickness, $W_{MC}$, that is between 100 nm and 120 nm. In the illustrative embodiment, the interconnects 140 and 142 are spaced apart by a lateral thickness, $W_{EE}$, along the x-axis, that is equal to a combined lateral thickness of the memory cells 118 and 120 and the lateral thickness, $W_I$ of the interconnect structure 112, as given by equation [1]:

$$W_{EE} = W_I \pm 2 \ast W_{MC} \quad [1]$$

where, $W_{MC}$ is a lateral thicknesses, of each of the memory cells 118, 120, 136 and 138. In an exemplary embodiment, $W_{MC}$ is the same or substantially the same for each memory cell 118, 120, 136 and 138. $W_I$ may be increased or decreased in proportion to $W_{MC}$ to keep $W_{EE}$ fixed.

Lateral thickness of features of pillar select transistor 102 are related to dimensions of the memory cells 118 and 120 and interconnect 112 in tier 132. $W_{EE}$ may be greater than or comparable to $W_S$. However, for functionality it is advantageous for $W_S$ to be compared to another lateral dimension of the memory array. To prevent gate dielectric layers of adjacent transistors (in an array) from connecting, the source contact has a lateral thickness $W_S$, that is related to a lateral thickness, $W_{MC}$, of a memory unit described by equations [2] and [3] below:

$$W_S < W_{MU} \quad [2]$$

$$\text{Where, } W_{MU} = W_I + 2 \ast (W_{MC} + \tfrac{1}{2} W_E) \quad [3],$$

where $W_E$, is equal to a lateral thickness of the interconnect 140 and 142. In embodiments, $W_E$, is between 35 nm and 50 nm.

Lateral thicknesses of features of the tiered memory structure 103 may also be related to lateral thickness of features of pillar select transistor 102. In the illustrative embodiment, $W_I$ is less than $W_S$. In embodiments, $W_I$ is between 50 nm and 70 nm and $W_S$ is at least 200 nm but less than 300 nm. In embodiments the source structure 106 has a lateral thickness that is less than two times a lateral thickness of a memory cell. i.e, $W_S$ is less than $2*W_{MC}$.

In an embodiment, transistor channel layer 104 includes a polycrystalline or an amorphous material that is suitable for a thin film transistor channel In some embodiments, channel layer 104 includes an n-type semiconductor material. Examples of n-type semiconductor material include two or more of In, Ga, Zn, Mg, Al, Sn, Hf, O, W such as $In_2O_3$, $Ga_2O_3$, ZnO, InGaZnO, InZnO, InGaO, GaZnO, InAlO, InSnO, InMgO, InWO, GaZnMgO, GaZnSnO, GaAlZnO, GaAlSnO, HfZnO, HfInZnO, HfAlGaZnO or InMgZnO.

An n-type transistor channel layer 104 may be doped with Ti, W, Cu, Mn, Mg, Fe, Hf, Al, Ni, CO or Ru, for example. In some embodiments, the channel layer 104 includes a dopant concentration between $10^{16}$ and $10^{20}$ atoms/cm$^3$. In other embodiments, the channel layer 104 includes a p-type material. Examples of p-type semiconductor material include $CuO_x$ (where x is 1 or 2), NbO, NiO, CoO, SnO, $Cu_2O$, AgAlO, $CuAlO_3$, AlScOC, $Sr_3BPO_3$, $La_2SiO_4Se$, LaCuSe, $Rb_2Sn_2O_3$, $La_2O_2S_2$, $K_2Sn_2O_3$, $Na_2FeOSe_2$ or $ZnRh_2O_4$. Thickness of the channel layer 104 may be material dependent and may be between 1 nm to 80 nm.

In embodiments, the gate dielectric layer 111 includes a material having a high dielectric constant or high-K material. Examples of gate dielectric layer 111 include oxygen and one or more of elements such as hafnium, silicon, titanium, tantalum, lanthanum, aluminum, zirconium, barium, strontium, yttrium, lead, scandium, niobium, or zinc. Examples of high-K material that may be used in the gate dielectric layer 111 include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In an embodiment, the gate electrode 110 includes at least one P-type work function metal or an N-type work function metal, depending on whether a transistor is to be a P-FET or an N-FET transistor. Examples of N type material include hafnium, zirconium, titanium, tantalum, aluminum, alloys of these metals, and carbides of these metals such as hafnium carbide, zirconium carbide, titanium carbide, tantalum carbide, or aluminum carbide and examples of P type materials include ruthenium, palladium, platinum, cobalt, nickel, or conductive metal oxides, e.g., ruthenium oxide.

In an embodiment, interconnect 112 includes copper, tungsten, tantalum, titanium, hafnium, zirconium, aluminum, silver, tin, lead, ruthenium, molybdenum, cobalt, and their alloys, or compounds including nitrogen and one or more of copper, tungsten, tantalum, titanium, hafnium, zirconium, aluminum, silver, titanium, tin or lead. In some embodiments, interconnect 112 includes metal carbides such as hafnium carbide, zirconium carbide, titanium carbide, tantalum carbide or aluminum carbide.

In an embodiment, interconnects 114 and 116 each include copper, tungsten, tantalum, titanium, hafnium, zirconium, aluminum, silver, tin, lead, ruthenium, molybdenum, cobalt, and their alloys, or alloy including nitrogen and one or more of copper, tungsten, tantalum, titanium, hafnium, zirconium, aluminum, silver, titanium, tin or lead. In some embodiments, interconnect 112 includes metal carbides such as hafnium carbide, zirconium carbide, titanium carbide, tantalum carbide or aluminum carbide.

In an embodiment interconnect 140 and 142 each include copper, tungsten, tantalum, titanium, hafnium, zirconium, aluminum, silver, tin, lead, ruthenium, molybdenum, cobalt, and their alloys, or alloy including nitrogen and one or more of copper, tungsten, tantalum, titanium, hafnium, zirconium, aluminum, silver, titanium, tin or lead. In some embodiments, interconnect 112 includes metal carbides such as hafnium carbide, zirconium carbide, titanium carbide, tantalum carbide or aluminum carbide.

In an embodiment, memory cell portions 118A, 120A, 136A and 138A each include a selector element coupled in series with a nonvolatile memory element.

Figure 1C:
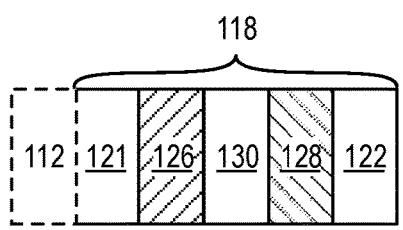
FIG. 1C is a cross-sectional illustration of a memory cell, in accordance with an embodiment of the present disclosure.

FIG. 1C is a cross-sectional illustration of a memory cell such as memory cell 118. In the illustrative embodiment, memory cell 118 includes a memory element 126 and a selector element 128 coupled though a terminal 130. In embodiments, either all the memory elements 126 or all the selector elements 128 of memory cells 118, 120, 136 or 138 are simultaneously coupled to the interconnect 112 (in dashed box) through terminal 121. For example, as shown, memory element 126 is adjacent to the terminal 121 and the selector element 128 is adjacent to the terminal 122. In other embodiments, the memory element 126 is adjacent to the terminal 122 and the selector element 128 is adjacent to the terminal 122 (configuration not illustrated). Referring again to FIG. 1A, for operational advantages, a combination of voltage bias on gate electrode 110 and source structure 106 in pillar select transistor 102, relative to interconnect 112 can energize each pair of memory cells within tier 132 and 134. Symmetrically arranged selector or memory elements within each memory cell 118, 120, 136 or 138 with respect interconnect 112, can enable uniform programming operation, for example, setting or resetting in a filamentary resistive random access memory device for example. However, while terminal 121 of all memory cells 118, 120, 136 and 138 may be electrified by transistor 102, a single memory cell can be chosen for programming by application of a bias voltage on any one of the interconnects 114, 116, 140 and 142.

Figure 1D:
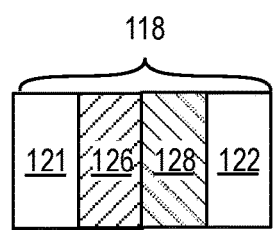
FIG. 1D is a cross-sectional illustration of a memory cell, in accordance with an embodiment of the present disclosure.

In some embodiments, the memory element 126 is directly adjacent to a selector element 128 as shown in FIG. 1D. In some such embodiments, there is no electrode between one or more switching layers in memory element 126 and one or more insulator layers within selector element 128, for example. Description of switching layer and insulator layer of memory element 126 and selector element 128, respectively, are described herein.

Figure 2A:
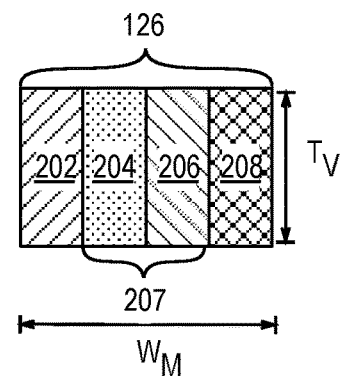
FIG. 2A is a cross-sectional illustration of a memory element, in accordance with an embodiment of the present disclosure.

FIG. 2A is a cross-sectional illustration of a memory element. In some embodiments all memory cells within a given tier 132 or 134 have the same configuration. The memory element may include phase change memory (PCM), a resistive random access memory (R-RAM), ovonic threshold switching (OTS) memory or a conductive bridge RAM (CBRAM).

In one embodiment, the memory element 126 is a resistive random-access memory (RRAM) device. In the illustrated embodiment, the memory element 126 includes an electrode 202, a switching layer 204 adjacent to the electrode 202, an oxygen exchange layer 206 adjacent to the switching layer 204, and an electrode 208 adjacent to the oxygen exchange layer 206. The switching layer 204 and oxygen exchange layer 206 may be collectively referred to as a storage layer 207. In embodiments where electrode 202 includes a material of the terminal 121, the switching layer 204 can be directly adjacent to the terminal 121. In some such embodiment, electrode 208 when present, may be directly adjacent to a selector element, such selector element 128 shown in FIG. 1C.

Referring again to FIG. 2A, in an embodiment, electrode 202 includes an amorphous layer. In an embodiment, electrode 202 is a topographically smooth electrode. In an embodiment, electrode 202 includes a material such as W, Ta, Mo, Ru, Co TaN or TiN. In an embodiment, electrode 202 has a lateral thickness is between 1 nm and 10 nm. In an embodiment, electrode 208 includes a material such as W, Ta, Mo, Ru, Co TaN or TiN. In an embodiment, electrode 208 has a lateral thickness is between 1 nm and 10 nm. In an embodiment, electrode 202 and electrode 208 include a same material to facilitate symmetric RRAM switching characteristics.

Switching layer 204 may be a metal oxide, for example, including oxygen and atoms of one or more metals, such as, but not limited to Hf, Zr, Ti, Ta or W. In the case of titanium or hafnium, or tantalum with an oxidation state +4, switching layer 204 has a chemical composition, $MO_X$, where O is oxygen and X is or is substantially close to 2. In the case of tantalum with an oxidation state +5, switching layer 204 has a chemical composition, $M_2O_X$, where O is oxygen and X is or is substantially close to 5. In an embodiment, switching layer 204 has a thickness is between 1 nm and 5 nm.

Oxygen exchange layer 206 acts as a source of oxygen vacancy or as a sink for $O^{2-}$. In an embodiment, oxygen exchange layer 206 is composed of a metal such as but not limited to, hafnium, tantalum or titanium. In an embodiment, oxygen exchange layer 206 has a thickness that is between 5 nm and 20 nm. In an embodiment, the thickness of oxygen exchange layer 206 is at least twice the thickness of switching layer 204. In another embodiment, the thickness of oxygen exchange layer 206 is at least twice the thickness of switching layer 204. The combined lateral thickness of storage layer 207 may be between 3 nm and 15 nm. In an embodiment, the memory element 126 has lateral thickness, $W_M$, that is between 15 nm and 35 nm. In an embodiment, the memory element 126 has a vertical thickness, $T_V$, that is between 5 nm and 35 nm. In embodiments where the electrode 202 includes a material that is the same as the material of the terminal 121 (not shown), then memory element does not include a separate electrode 202. In some such embodiments, where memory element 126 is directly adjacent to an insulator of selector element 128 (not shown), element 126 has a lateral thickness, $W_M$, that is between 7 nm and 15 nm.

Figure 2B:
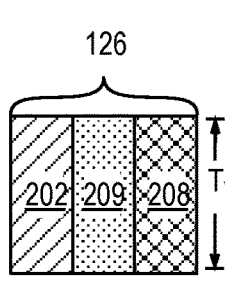
FIG. 2B is a cross-sectional illustration of a memory element, in accordance with an embodiment of the present disclosure.

In other embodiments, the non-volatile memory element 126 includes only electrodes 202 and 208 and an insulator 209 in between, as shown in FIG. 2B. In some such embodiments, the insulator layer 209 exhibits charge carrier tunneling behavior. In some such embodiments, the insulator layer 209 includes oxygen and a metal, such as, but not limited, to aluminum, hafnium, tantalum and titanium. In further embodiments, the insulator layer 209 is also doped with atoms of one or more metals, such as, but not limit to, copper, silver or gold. In some such embodiments, the insulator layer 209 is doped to a concentration between 2% to 10% (atomic) with atoms of one or more metals such as copper, silver or gold. In an embodiment, the insulator layer 209 has a thickness between 2 nm to 5 nm.

In another embodiment, the insulator layer 209 includes a threshold switching material such as a phase change material. In some examples, the insulator layer 209 may include a phase change material that exhibits at least two different electrical states characterized by two different resistances, a conductive state and a resistive state. In some examples, the phase change material exhibits at least two different material states, amorphous and crystalline that correspond to the two different resistance states. In an embodiment, a phase change material that is in a completely crystalline phase is conductive and resistive when the phase change material is in an amorphous state. However, by modulating the relative extent of crystalline phase and amorphous phase in a given volume of the phase change material, the resistance of the phase change material can be tuned. In an embodiment, the resistance state of the phase change material may be set by heating and cooling the phase change material in a specific manner by application of a voltage bias, e.g., between electrodes 202 and 208 to induce joule heating.

In an embodiment, the phase change material includes Ge and Te. In an embodiment, the phase change material further includes Sb. In an embodiment, the phase change material includes a ternary alloy of Ge, Te and Sb such as $Ge_2Sb_2Te_5$. In an embodiment, the phase change material includes a binary alloy, ternary alloy or a quaternary alloy including at least one element from the group V periodic table such as Te, Se, or S. In an embodiment, the phase change material includes a binary alloy, ternary alloy or a quaternary alloy which comprises at least one of Te, Se, or S, where the said alloy further comprises one element from the group V periodic table such as Sb. In an embodiment, the phase change material includes a dopant such as silver, indium, gallium, nitrogen, silicon or germanium. In an embodiment, the dopant concentration is between 5% and 20% of the total composition of the phase change material. In an embodiment, the insulator layer 209 has a thickness (measured along e.g., x-axis) that is between 2 nm and 15 nm.

Figure 2C:
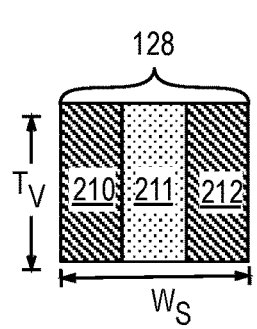
FIG. 2C is a cross-sectional illustration of a selector element, in accordance with an embodiment of the present disclosure.

FIG. 2C is a cross-sectional illustration of a structure of a selector element 128, in accordance with an embodiment of the present disclosure. As shown the selector device includes a metal-insulator-metal (MIM) stack. The MIM stack of selector element 128 includes a selector electrode 210, and an insulator layer 211 between the selector electrode 210 and a selector electrode 212. In embodiments, the insulator layer 211 includes a ovonic threshold switching material. In an embodiment, the insulator includes alloy of Ge, As and Se, such as GeAsSe, GeSe or AsSe. In some embodiments, alloys of Ge, As and Se may include dopants, for example As doped GeSe, Ge doped AsSe or GeAsSe doped with In, Te or Sb. In embodiments, the insulator layer 211 has a thickness that is material dependent. In exemplary embodiments, the thickness is between 5 nm and 30 nm. Electrodes 210 and 212 may include a material that is the same or substantially the same as a material of electrodes 202 and 208.

In another embodiment, the insulator layer 211 includes a material that can undergo a reversible insulator to metal transition. In an embodiment, the transition is triggered by a thermal process. In another embodiment, the transition is triggered by an electrical process. The insulator to metal transition is characterized by a high resistance insulator state and a low resistance metallic state. In some such embodiments, the insulator layer transition comprises the development of filamentary conduction in which a filament may extend through the insulator to couple the selector electrodes 210 and 212. The extent of such a filament may modulate during the transition between the insulator and metallic states as a function of voltage developed across selector electrodes 210 and 212. In some such embodiments, the insulator layer 211 includes oxygen and atoms of one or more metals, such as, but not limited to niobium, vanadium and tantalum. In some specific examples, the insulator layer 211 includes vanadium (IV) oxide, $VO_2$ and vanadium (V)

oxide, $V_2O_5$ and niobium (V) oxide, $Nb_2O_5$. In one specific example, the insulator layer 211 includes niobium (V) oxide, $Nb_2O_5$ and may exhibit filamentary conduction. When the insulator layer 211 includes a material exhibiting filamentary conduction, a filament may manifest within the insulator layer 211. In an embodiment, the insulator layer 211 is amorphous. In an embodiment, the insulator layer 211 which can undergo an insulator to metal transition has a thickness between 5 nm and 30 nm.

Figure 2D:
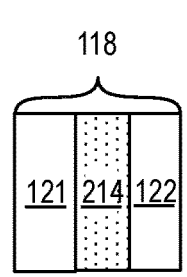
FIG. 2D is a cross-sectional illustration of a built-in memory selector cell, where an insulator layer exhibits memory element and selector element characteristics.

In some embodiments where insulator-to-metal transition is to occur, the insulator layer 211 further includes a dopant such as silver, copper or gold. In an embodiment, the dopant concentration is between 0.1-10% of the total composition of the insulator layer 211. A dopant concentration between 0.1-10% may facilitate filament conduction. Reducing the thickness of the insulator layer 211 may reduce the amount of voltage needed across selector electrodes 210 and 212 for filamentary conduction to develop but can lead to a breakdown and degradation of a volatile filament. In an embodiment, the selector electrode 210 includes a conductive material such as TiN and TaN or a metal such as Ta, W or Pt. In an embodiment, the selector electrode 210 has a thickness between 2 nm and 10 nm. In an embodiment, the selector electrode 212 includes a conductive material such as TiN and TaN or a metal such as Ta, W or Pt. In an embodiment, the selector electrode 212 has a lateral thickness between 2 nm and 25 nm. In embodiments, selector element 128 has a vertical thickness, $T_V$, that is between 5 nm and 35 nm. FIG. 2D is a cross-sectional illustration of a memory cell 118 that includes terminals 121 and 122 and an insulator layer 214 between terminals 121 and 122 that includes characteristics of a selector and a memory cell. In some such embodiments, insulator layer 214 includes an ovonic threshold switching material such as layer 211 that may function as a built-in-selector memory. In embodiments, the insulator layer 214 can exhibit selector or memory behavior that is dependent on a polarity and magnitude of an applied voltage pulse between the terminal 121 and terminal 122. In one embodiment, the insulator exhibits an RRAM like behavior where the applied voltage induces a resistance change in the insulator layer 214. The application of the electrical pulse drives dopants in the insulator layer 214 towards terminal 121 or 122 and changes the electrochemical potential of the insulator layer 214. A change in electrochemical potential can manifest in a resistance change. In other embodiments, application of a one-time voltage pulse (OTP) causes an electrical breakdown and permits conduction through the insulator layer 214, a behavior resembling a selector.

Figure 2E:
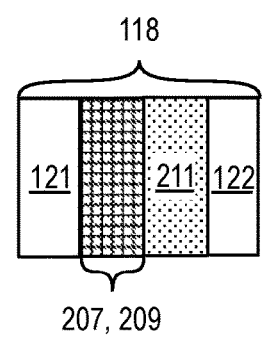
FIG. 2E is a cross-sectional illustration of a switching layer adjacent to an insulator layer, in accordance with an embodiment of the present disclosure.

In some such embodiments, insulator layer 209 or storage layer 207 of a memory element is directly adjacent to insulator layer 211 of a selector element as shown in FIG. 2E. In some such embodiments, there is no electrode between insulator layer 209 or storage layer 207 and insulator layer 211. In some such embodiments, each of the terminals 121 and 122 may also function as electrodes for the memory cell 118.

Figure 3A:
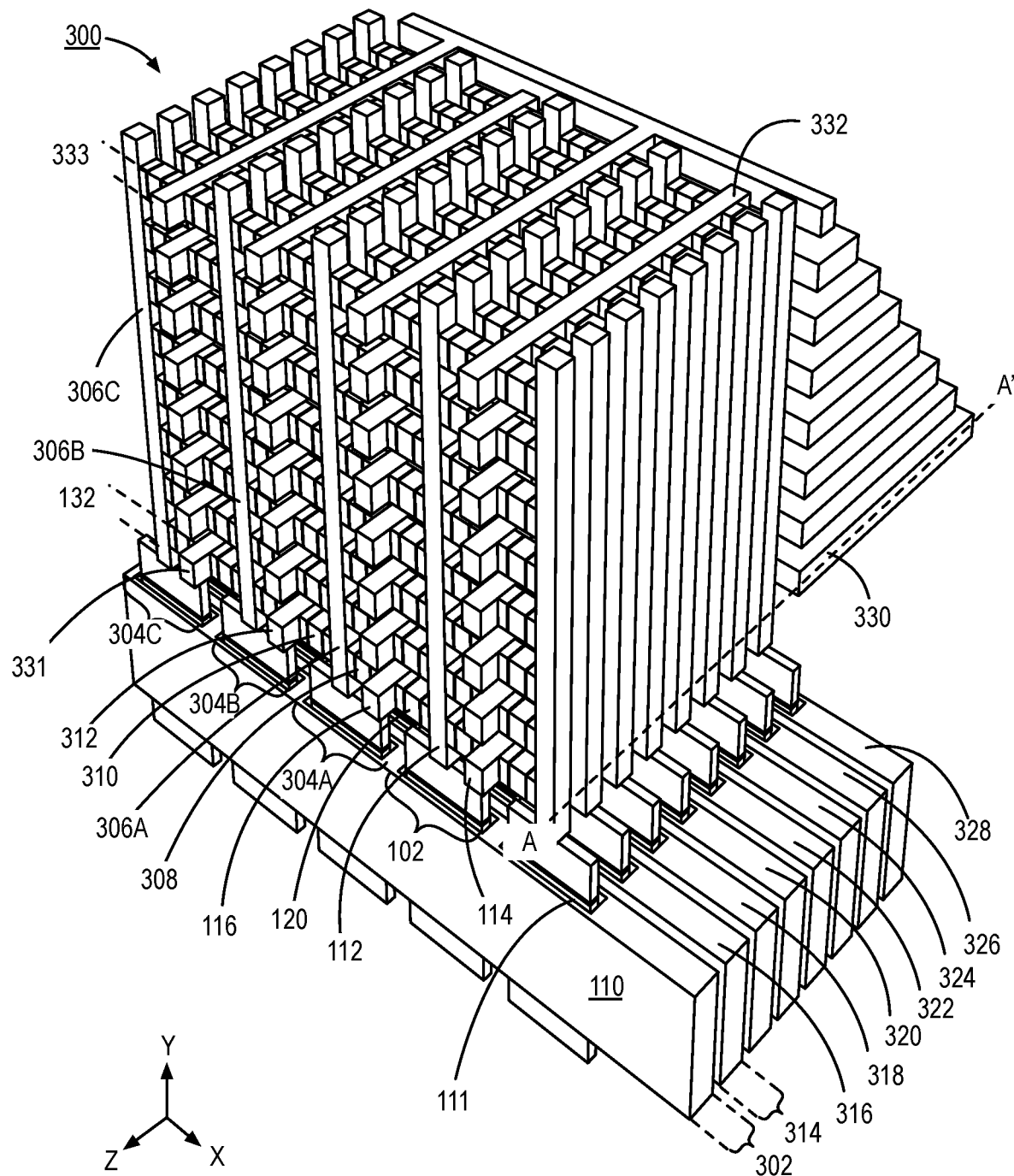
FIG. 3A is an isometric illustration of memory device structure including a vertical transistor array coupled with a tiered memory array, in accordance with an embodiment of the present disclosure.

FIG. 3A is an isometric illustration of the structure of a multi-tier memory array 300. In the illustrative embodiment, the multi-tier memory array 300 includes an array of transistors 302 (herein transistor array 302) along the x-axis. In the illustrative embodiment, the transistor array 302 includes pillar select transistor 102, 304A, 304B and 304C. As shown, each pillar select transistor 102, 304A, 304B and 304C is coupled with an interconnect such as interconnect 112. As shown, a transistor 304A is coupled with interconnect 306A, transistor 304B is coupled with interconnect 306B, and transistor 304C is coupled with interconnect 306C. In an exemplary embodiment, transistors 304A, 304B and 304C are substantially identical to pillar select transistor 102 and gate electrode 110 is shared among each pillar select transistor 102, 304A, 304B and 304C. In embodiments where the gate electrode 110 includes a work function metal and a fill metal, the work function metal clads the gate dielectric layer 111.

In the illustrative embodiment interconnect 306A is colinear with the longitudinal axis (e.g., y-axis) of transistor 304A, interconnect 306B is colinear with the longitudinal axis of transistor 304B and interconnect 306C is colinear with the longitudinal axis of transistor 304A. The interconnects 306A, 306B and 306C includes a material that is the same or substantially the same as the material of the interconnect 112.

Tier 132 further includes a single memory cell between an interconnect that extends in a longitudinal direction and an electrode that extends along a horizontal direction. For example, a memory cell 308 is coupled between interconnect 116 and interconnect 306A and a memory cell 310 coupled between interconnect 306A and electrode 312. Memory cells 308 and 310 include one or more features of the memory cells 118 or 120. Interconnect 116 is shared between memory cells 308 and 120.

Multi-tier memory array 300 further includes a plurality of transistor arrays parallel to transistor array 302. In the illustrative embodiment, there are 8 transistor arrays parallel to transistor array 302. In other embodiments, the number of transistor arrays is greater than 8. Each array includes one or more features of transistor array 302. In the illustrative embodiment, transistor array 314 is adjacent to but separated from array 302. Each gate electrode such as electrode 110, 316, 318, 320, 322, 324, 326 and 328 within distinct transistor arrays may each be electrically coupled to a respective routing conductor (not shown).

As shown, two or more interconnects on a single tier are coupled to one of two lateral extensions, such as lateral extension 330. In the illustrative embodiment, interconnects 116 and 331 are coupled to the same lateral extension 330. As shown, interconnect 332 in tier 333 is coupled with a second of the two lateral extensions, where a second of the two lateral extensions is in a foreground of the multi-tier memory array 300, and not shown for clarity. Lateral extension 330 includes a same material as the material of interconnect 116.

Figure 3B:
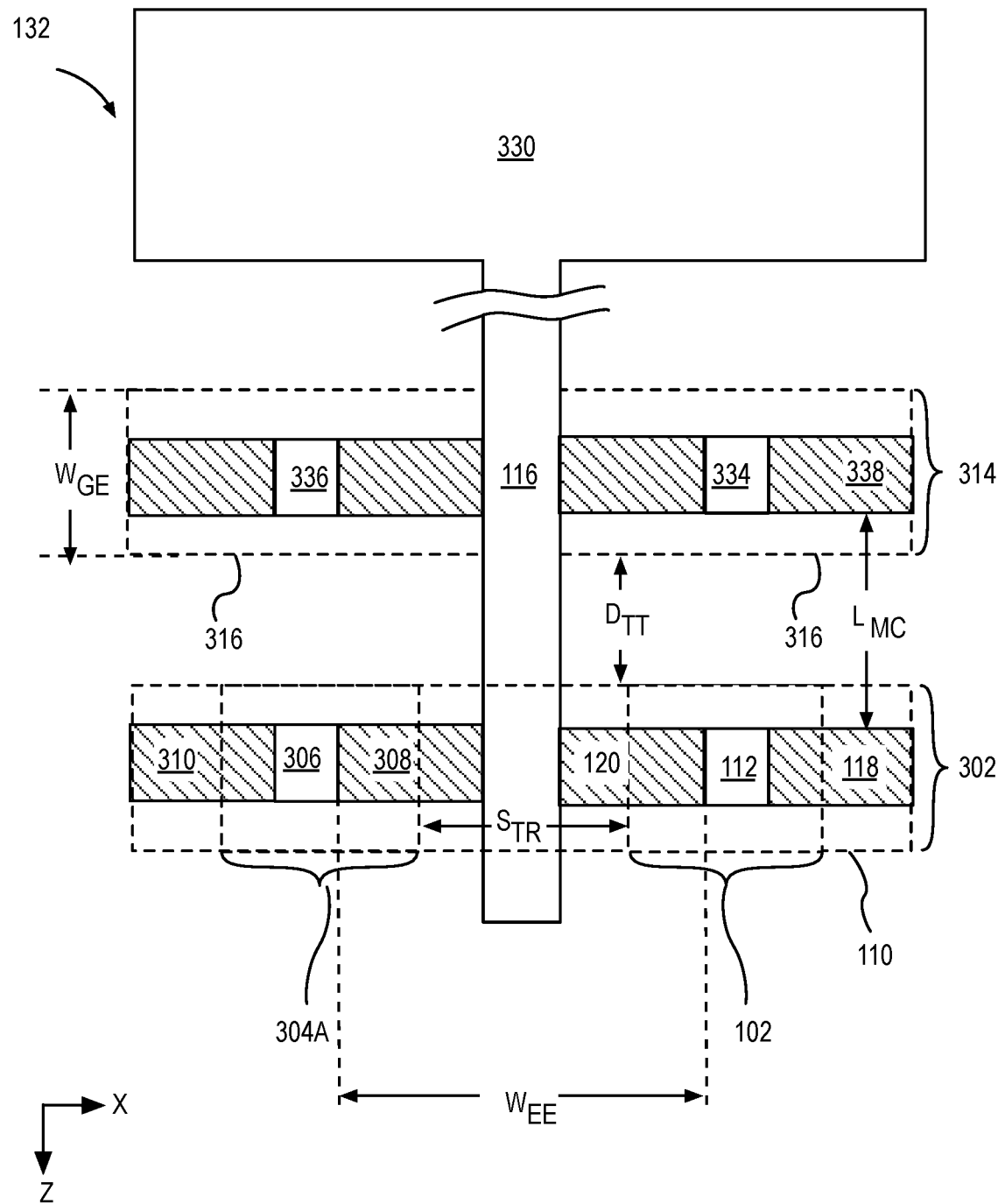
FIG. 3B is a plan view of a portion of a tier of the memory device structure in FIG. 3A.

FIG. 3B is a plan view illustration of a portion of transistor arrays 302 and 314 through a mid-plane (along a line A-A') of tier 132 in FIG. 3A. As illustrated, gate electrode 316 (in dashed box) of transistor array 314, extends laterally under interconnect 334, interconnect 116 and interconnect 336. Also shown is gate electrode 110 (in dashed box) of transistor array 302, which extends laterally under interconnect 112, interconnect 116 and interconnect 306. Only two transistor arrays 302 and 314 are illustrated in the Figure for clarity.

Gate electrodes 110 and 316 are separated by a distance $D_{TT}$, along the z-axis. In embodiments, $D_{TT}$ is between 40 nm and 70 nm. In exemplary embodiments, the spacing $D_{TT}$ is less than $W_{GE}$. A lateral distance, $L_{MC}$, (for e.g., along z-axis) between memory cells 118 and 338 places a constraint on a maximum width, $W_{GE}$, of gate electrodes 110 and 306. In embodiments, $D_{TT}$ is less than 60 nm. A minimum cell area is determined by a product of $L_{MC}$ and $W_{EE}$ (lateral spacing between interconnects 112 and 306.

While gate electrode 110 extends and electrically couples each pillar select transistor 102, 304A etc, a source structure of each transistor is laterally distant from each other by a spacing, $S_{TR}$. In embodiments $S_{TR}$ is between 50 nm and 70 nm.

In the illustrative embodiment, interconnect 116 extends along the z-axis, orthogonal to a lateral arrangement of the memory cells 118, 120 etc., as well as orthogonal to interconnects 112, 306, 334 and 336. The lateral extension 330 is connected with a single interconnect 116 in the plan view embodiment. Lateral extension 330 may be connected with a plurality of interconnects, e.g., interconnects parallel to interconnect 116 (on the X-Z plane), to enable selective addressing of a plurality of memory cells on tier 132.

Figure 3C:
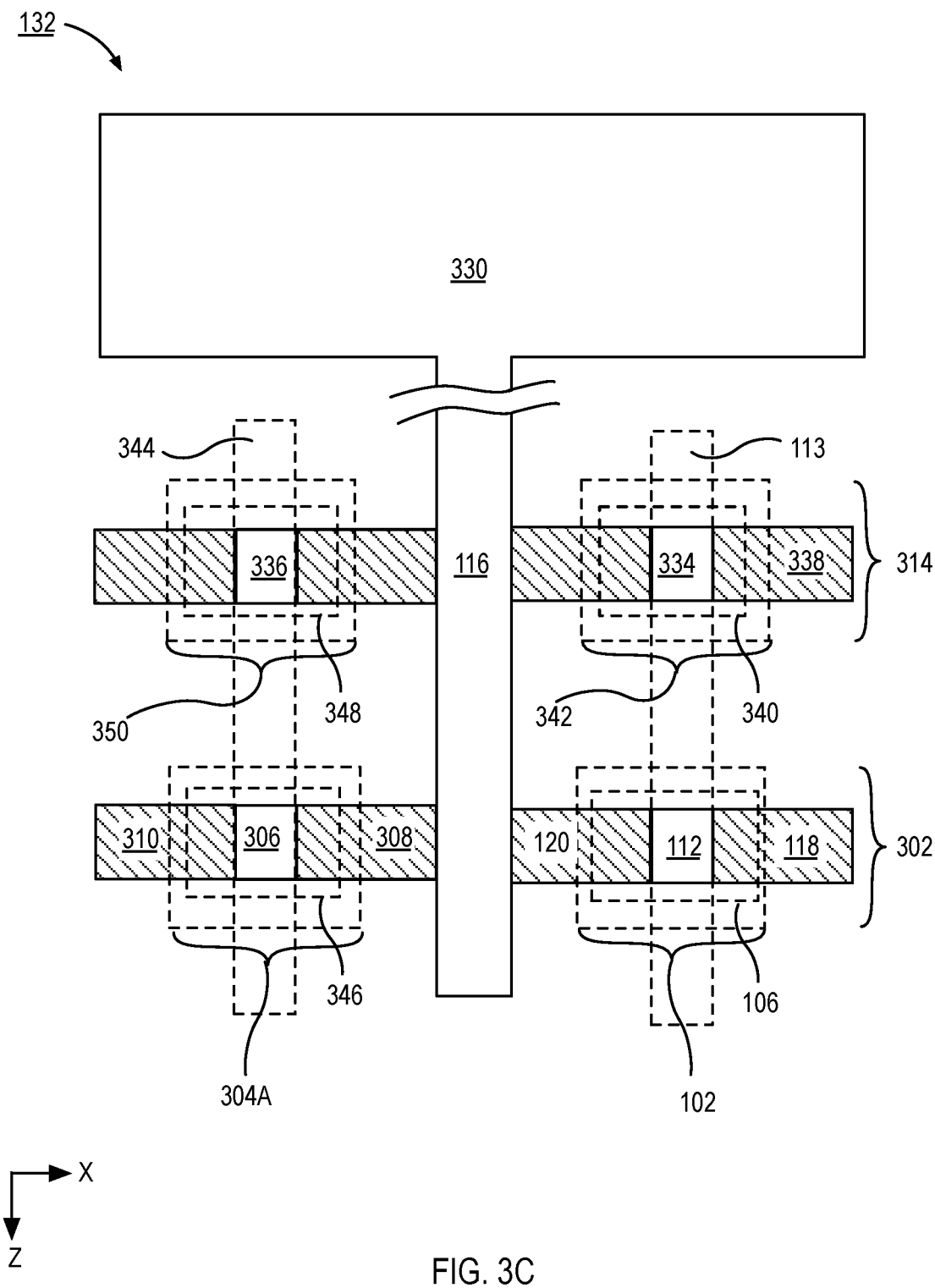
FIG. 3C is a plan view of a portion of a tier of the memory device structure in FIG. 3A.

FIG. 3C is a plan view illustration of a portion of transistor arrays 302 and 314 through a mid-plane (along a line A-A') of tier 132 in FIG. 3A. In the illustrative embodiment, interconnect 113 is coupled to the source structure 106 of transistor 102 and to a source structure 340 of transistor 344. Transistor 344 is a transistor in transistor array 314. Interconnect structure 340 advantageously enables source structures from a plurality of transistors from different transistor arrays (such as 302 and 314) to be energized simultaneously. Only two transistor arrays 302 and 314 are illustrated in the Figure for clarity.

Additionally, as shown, interconnect 344 is coupled to the source structure 346 of transistor 304A and to a source structure 348 of transistor 350. Transistor 350 is a transistor in transistor array 314. Interconnect structure 344 advantageously enables source structures from a plurality of transistors from different transistor arrays (such as 302 and 314) to be energized simultaneously. Interconnects 113 and 344 may be operated independently.

FIGS. 4A-8 illustrate various cross sectional and isometric illustrations that are associated with operations to fabricate memory cells such as memory cell 118 or 120.

FIG. 4A illustrates a material layer stack 400 formed above a dielectric 402. In the illustrative embodiment, forming the material layer stack 400 includes forming a plurality of bilayers 404, where each bilayer 404 includes a dielectric layer 406 and a dielectric layer 408 on dielectric layer 406. In an embodiment, the dielectric layer 406 is blanket deposited by a (PECVD) or a chemical vapor deposition (CVD) process. In an embodiment, the dielectric layer 406 includes silicon and at least one of nitrogen, or carbon, for example, silicon nitride, or silicon carbide. The dielectric layer 406 in a lowest bilayer acts an etch stop during formation of pillar vias. The deposition process continues with deposition of a dielectric layer 408 on the dielectric layer 406. In an embodiment, the dielectric layer 408 includes silicon, and oxygen. In other embodiments, the dielectric layer 408 includes silicon, and oxygen and at least one of nitrogen, or carbon. The material of the dielectric layer 406 is different from the material of the dielectric layer 408, where either dielectric layer 406 or dielectric layer 408 can be removed or etched selectively to the other. The dielectric layer 408 may be blanket deposited by a (PECVD) or a chemical vapor deposition (CVD) process to a thickness between 20 nm and 40 nm. The thickness of dielectric layer 408 determines a maximum thickness of a memory cell that can be formed. The deposition process continues with a formation of a plurality of bilayers 404.

In an embodiment, dielectric 402 includes silicon and one or more of oxygen, nitrogen or carbon, such as silicon oxide, silicon-oxynitride, silicon nitride, silicon oxy-carbide or silicon carbide.

FIG. 4B is a cross-sectional illustration of the structure in FIG. 4A following the process to mask and etch to form a staircase structure. In an embodiment, a plasma etch process is utilized to mask and etch dielectric layer 406 and 408 in the individual bilayers. In an embodiment, the staircase structure is representative of the plurality of lateral extensions discussed herein. In an embodiment, the lowest level of the dielectric 408 is representative of the lateral extension 330 (prior to formation of a conductive lateral extension 330) described in association with FIG. 3A.

FIG. 4C is a cross-sectional illustration of a material layer stack portion 410 of the structure FIG. 4B, following the process to etch and form plurality of openings 412 and 413. In an embodiment, a plasma etch process is utilized to etch the plurality of bilayers 404. In an embodiment, the opening 412 and 413 has substantially vertical sidewall profiles relative to an uppermost surface of the dielectric 402.

FIG. 4D illustrates the structure of FIG. 4C following a process to laterally recess portions of the dielectric 406, selectively to the dielectric 408 and 402 to form a plurality of recesses 409. In an embodiment, the lateral recess may be formed by an atomic layer etching process, a plasma etch process, a wet chemical process or a combination thereof.

In an embodiment, the lateral recess in the dielectric 406 in material layer stack portions 410A, 410B and 410C has a substantially similar width. In an embodiment, the lateral recess has a width, $W_M$, that is chosen to accommodate formation of a memory cell, such as memory cell 118. Additionally, in the cross-sectional illustration dielectric 406 has three portions 406A, 406B and 406C in each bilayer 404. For example, portion 406A is within material layer stack portion 410A, portion 406B is within material layer stack portion 410B, and portion 406B is within material layer stack portion 410C. In an embodiment, material layer stack portion 410A and 410C have a width that are chosen to accommodate formation of one memory cell, and material layer stack portion 410B has a width that is chosen to accommodate the formation of two memory cells adjacent to dielectric 406.

The dielectric 406 is a material that will be substituted for a conductor material of a tier, such as conductor 124 or 126 in a downstream operation. Dielectric 406 has a vertical thickness that is representative of at thickness of a tier such as tier 132 or 134.

Figure 4E:
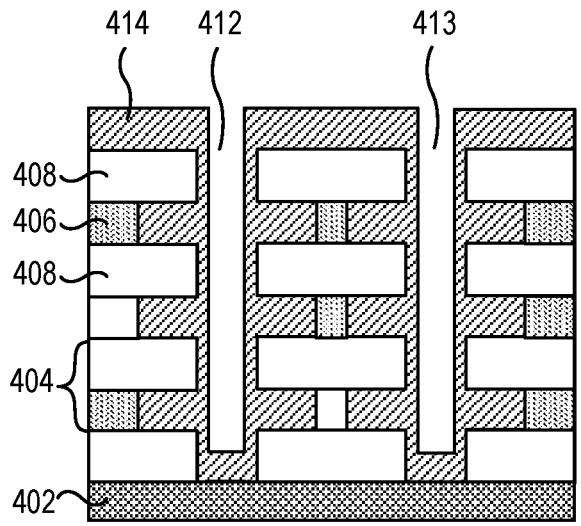
FIG. 4E illustrates the structure of FIG. 4D following the formation of an electrode material in the plurality of lateral recesses.

FIG. 4E illustrates the structure of FIG. 4D following the formation of an electrode material 414 in the openings 412 and 413 in the plurality of lateral recesses adjacent to dielectric 406. In an embodiment, the electrode material 414 is also deposited on the dielectric 402. In an embodiment, the electrode material includes a material that is the same or substantially the same as the material of the interconnect 114 or 116.

Figure 4F:
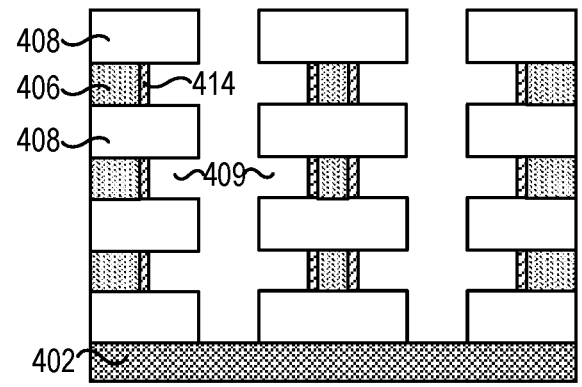
FIG. 4F illustrates the structure of FIG. 4E following the process to etch and remove portions of the electrode material from the plurality of openings and from portions of lateral recesses.

FIG. 4F illustrates the structure of FIG. 4E following the process to etch and remove portions of the electrode material 414 from the openings 412 and 413 and from portions of lateral recesses 409 adjacent to dielectric 406. A portion of electrode material 414 remains adjacent to the dielectric 406 between two alternating dielectric layers 408. In an embodiment, the electrode material 414 is removed by an atomic layer etch, a plasma etch process, a wet etch process or a combination thereof. In the illustrative embodiment, the electrode material 414 is also removed from surface of dielectric 402.

Figure 4G:
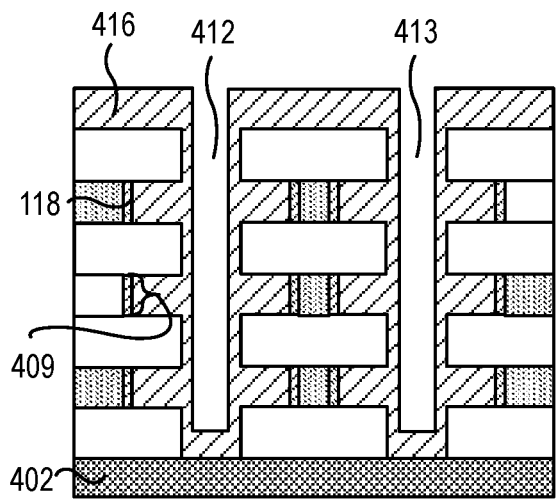
FIG. 4G illustrates the structure of FIG. 4F following the deposition of a selector material in the plurality of recesses adjacent to the electrode material.

FIG. 4G illustrates the structure of FIG. 4F following the deposition of a selector material 416 in openings 412 and 413 and within plurality of recesses 409 adjacent to the electrode material 414. The selector material 416 is also deposited adjacent to dielectric 408. One or more layers of the selector material 416 may be deposited by an atomic layer deposition process. In an embodiment, the selector material 416 is also deposited on the dielectric 402.

Figure 4H:
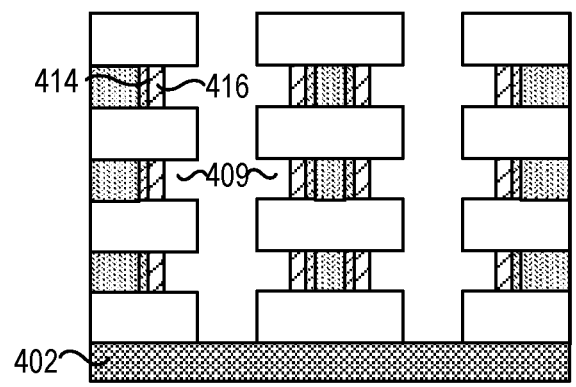
FIG. 4H illustrates the structure of FIG. 4G following the process to etch and remove portions of the selector material from portions of lateral recesses adjacent to the electrode material.

FIG. 4H illustrates the structure of FIG. 4G following the process to etch and remove portions of the selector material 416 from portions of lateral recesses 409 adjacent to electrode material 414. A portion of selector material 416 remains adjacent to the electrode material 414 between two alternating dielectric layers 408. In an embodiment, the selector material 416 is removed by an atomic layer etch, a plasma etch process, a wet etch process or a combination thereof. In the illustrative embodiment, portions of the selector material 416 are also removed from surface of dielectric 402.

FIG. 4I illustrates the structure of FIG. 4H following the formation of electrode material 418 adjacent to selector material 416. In an embodiment, the process to form electrode material 418 is the same or substantially the same as the process to form electrode material 414. Electrode material 418 may be deposited in openings 412 and 413 and within the plurality of recesses 409 adjacent to the selector material 416 by an atomic layer deposition process. Portions of the electrode material 418 may be etched and removed, such as from above dielectric 402 and from sidewall portions of dielectric 408 as well as from portions of the plurality of recesses 409.

FIG. 4J illustrates the structure of FIG. 4I following the deposition of one or more layers of memory material 420 in openings 412 and 413 and within the plurality of recesses 409 adjacent to electrode material 418. The memory material 420 is also deposited adjacent to selector material 416 and on the dielectric 402. In an embodiment, one or more layers of memory material 420 is deposited are deposited by an atomic layer deposition process to fill the plurality of recesses 409.

FIG. 4K illustrates the structure of FIG. 4J following the process to etch and remove portions of the memory material 420 and from portions of lateral recesses 409 adjacent to electrode material 418 and from between two alternating dielectric layers 408. In an embodiment, portions of the memory material 420 are removed by an atomic layer etch, a plasma etch process, a wet etch process or a combination thereof. In the illustrative embodiment, the memory material is also removed from surface of dielectric 402.

FIG. 4L illustrates the structure of FIG. 4K following the formation of electrode material 422 adjacent to the memory material 420, between any two alternating dielectric layers 408.

In an embodiment, the process to deposit and remove portions of electrode material 422 is the same or substantially the same as the process utilized to deposit and remove portions of electrode material 414. In an embodiment, electrode material 422 is deposited into the plurality of recesses 409 adjacent to the memory material 420 between two alternating dielectric layers 408. Portions of the electrode material 422 are etched and removed as described above, such as from above dielectric 402 and from portions of the plurality of recesses 409.

Figure 5A:
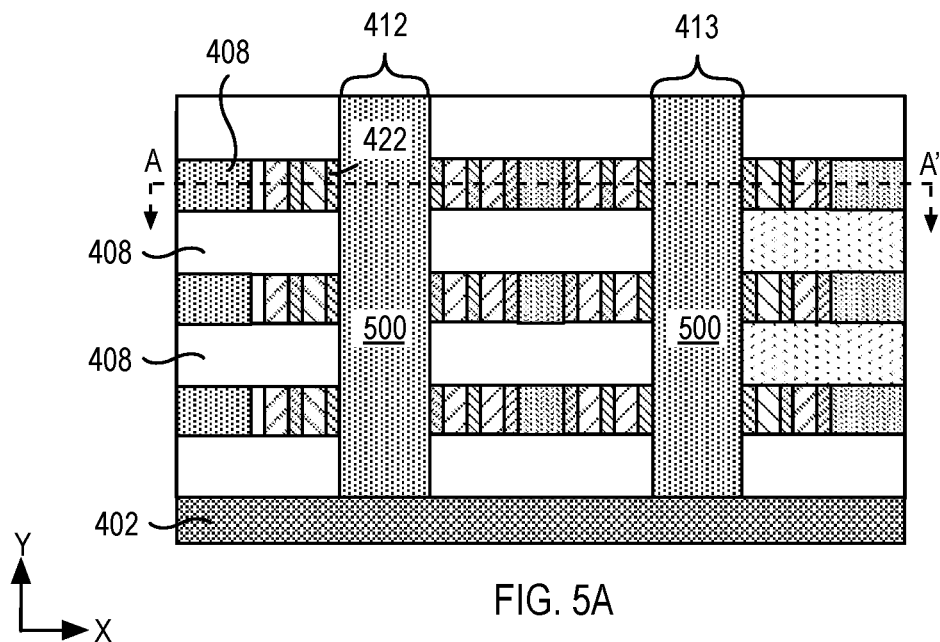
FIG. 5A illustrates the structure of FIG. 4L following the formation of a dielectric in the plurality of openings.

FIG. 5A illustrates the structure of FIG. 4L following the formation of a dielectric 500 in the openings 412 and 413. In an embodiment, the dielectric 500 is deposited in the openings 412 and 413, on the dielectric 402 and adjacent to dielectric 408, electrode material 422. The dielectric 500 may include silicon and one or more of oxygen, nitrogen or carbon. However, the dielectric 500 includes a material that can be etched selectively to dielectric 402, 406 and 408 in a subsequent downstream operation.

Figure 5B:
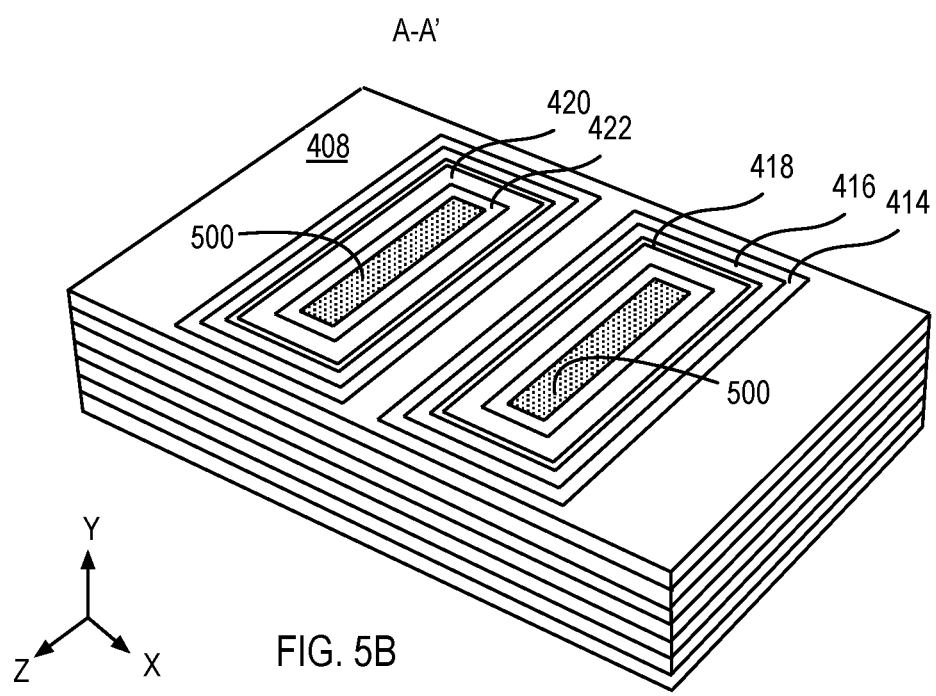
FIG. 5B is an isometric illustration of the structure in FIG. 5A through the line A-A'.

FIG. 5B is an isometric illustration of the structure in FIG. 5A through the line A-A'. As shown dielectric 500 is laterally surrounded by electrode material 422. In the illustrative embodiment, the electrode material 422 is laterally surrounded by memory material 420, memory material 420 is laterally surrounded by electrode material 418, electrode material 418 is laterally surrounded by selector material 416, and selector material 416 is laterally surrounded by electrode material 414. In the illustrative embodiment, the formation of two ringed structures can enable formation of 4 memory cells.

Figure 6A:
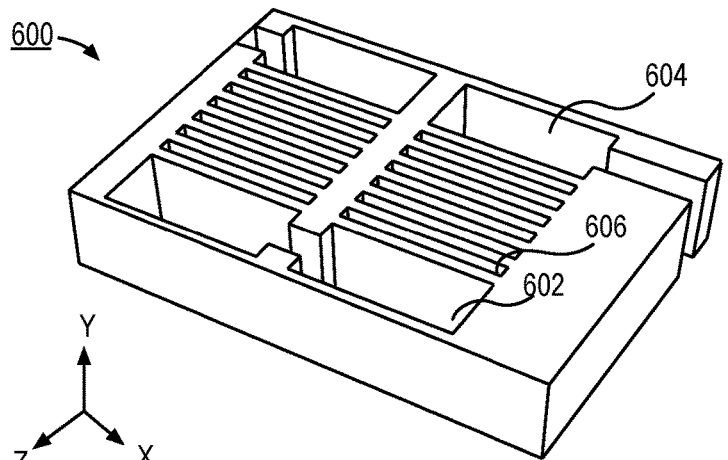
FIG. 6A is cross sectional illustration of a cut mask implementation to form individual memory cells.

FIG. 6A is cross sectional illustration of a cut mask implementation to form individual memory cells. In the illustrative embodiment, mask 600 is formed on the structure of FIG. 5A. Mask 600 has features such as a plurality of openings 602, 604. In the illustrative embodiment, openings 602 and 604 are utilized to remove end caps and the plurality of openings 606 will be utilized to form memory cells.

Figure 6B:
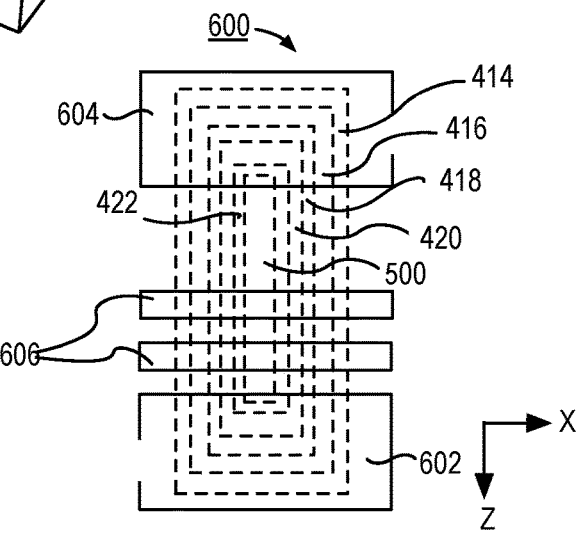
FIG. 6B is a plan view illustration of a portion of the mask over structure of FIG. 5A.

FIG. 6B is a plan view illustration of a portion of the mask over structure of FIG. 5A. In the illustrative embodiment, the openings 602 and 604 are utilized to form isolated memory cells. An outline of the electrode material 422, memory material 420, electrode material 418, selector material and electrode material 414 is shown via dashed lines to illustrate regions that will be removed by portions of the mask 600.

Figure 7:
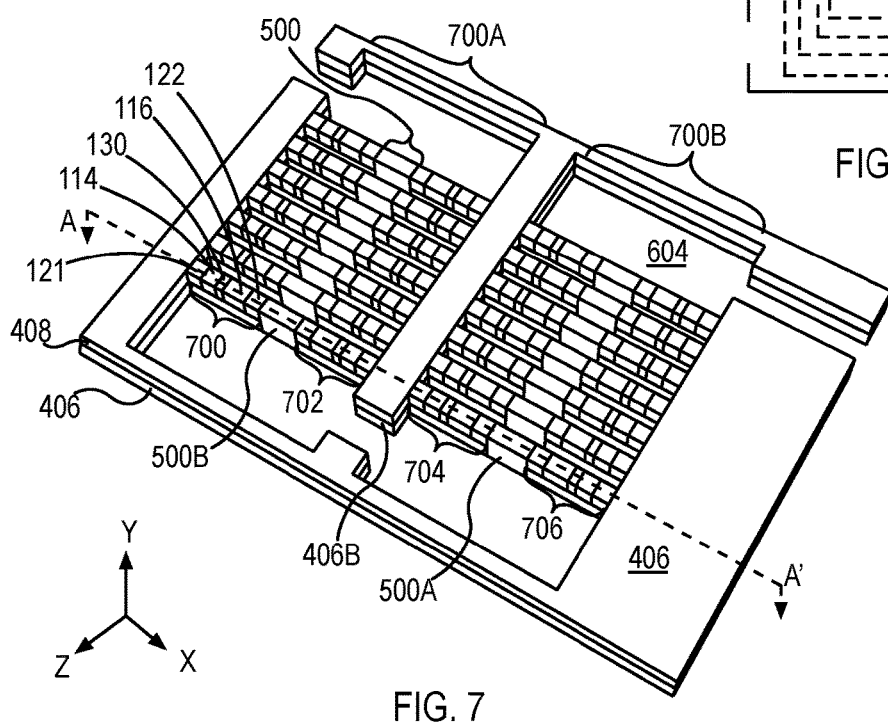
FIG. 7 is an isometric illustration of the structure in FIG. 5A post a cut etch process.

FIG. 7 is an isometric illustration of the structure in FIG. 5A post a cut etch process. In the illustrative embodiment, the cut etch process etches portions of dielectric 408 and 406, dielectric 500, electrode material 422, memory material 420, electrode material 418 and selector material 416. In the illustrative embodiment, the process of etching forms cell blocks 700A and 700B. A single tier is shown in the isometric illustration.

Etching also forms a plurality of discrete dielectric blocks, such as dielectric blocks 500A and 500B. The etching process also forms memory cells 700, 702, 704 and 706. The memory cells in the illustrative embodiment have a rectangular prism shape. As shown, memory cells have sidewall surfaces that are substantially vertical. In other embodiments sidewalls may be tapered. In some embodiments, the cut etch process forms sidewalls of memory cells 700, 702, 704 and 706 are substantially co-planar with sidewalls of the dielectric portions 500A and 500B. In other embodiments, sidewalls of memory cells 700, 702, 704 and 706 are not co-planar with sidewalls of the dielectric portions 500A and 500B.

As shown, dielectric blocks 500A and 500B are formed between memory cells 700 and 702, and between 704 and 706 respectively. Also as shown, the process of etching forms terminal 121, terminal 122, terminal 130, selector element 128 and memory element 126 in each memory cell. In an exemplary embodiment, there are 16 memory cells in each cell block. The number of desired memory cells may be chosen by a design of the mask 600 (not shown).

It is to be appreciated that the dielectric 406 is separated into two portions dielectric portion 406A and dielectric portion 406B after the cut etch process.

In other embodiments, the process described above may be modified to alter the composition of the memory cell 700, such as memory cell 700.

Figure 8A:
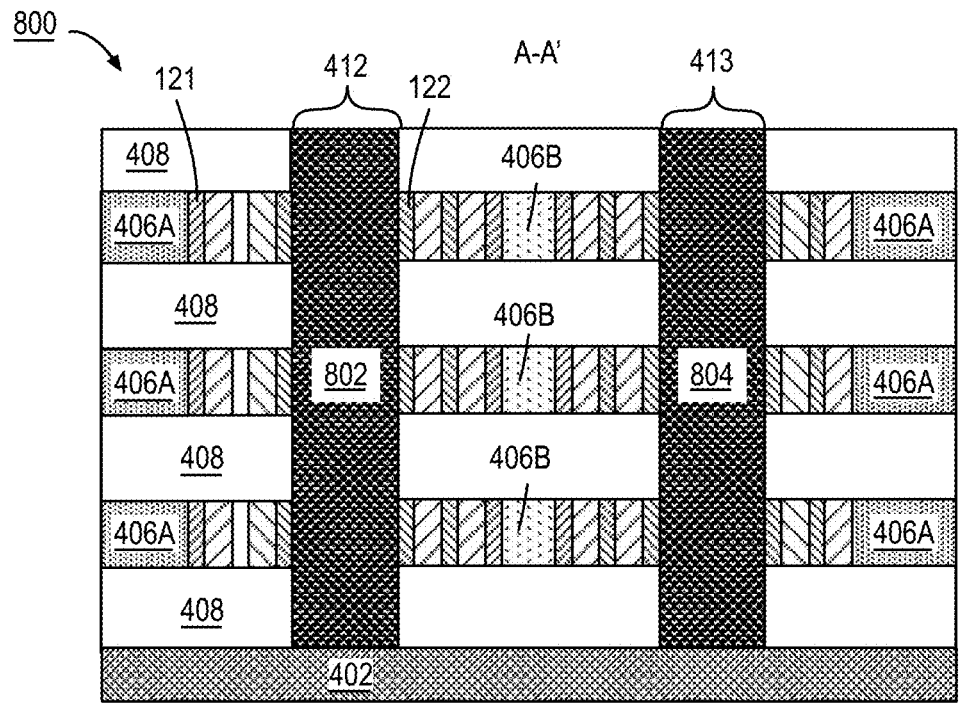
FIG. 8A is a cross sectional illustration of the structure in FIG. 7 through the line A-A', following the process to form electrodes.

FIG. 8A is a cross sectional illustration of the structure in FIG. 7 through the line A-A', following the process to form electrodes 802 and 804. In the illustrative embodiment, three layers or tiers of vertically arranged memory cells are shown. In other embodiments, the number of tiers can be up to 8.

In an embodiment, dielectric blocks 500A and 500B are removed. In an embodiment, a plasma etch, a wet etch or a combination thereof may be utilized to remove dielectric blocks 500A and 500B to re-form openings 412 and 413. In an embodiment, an electrode material is deposited in the openings 412 and 413, adjacent to terminal 122 of each memory cell, and on dielectric 402. The electrode material may be polished after deposition to form a multi-tiered memory array 800.

Figure 8B:
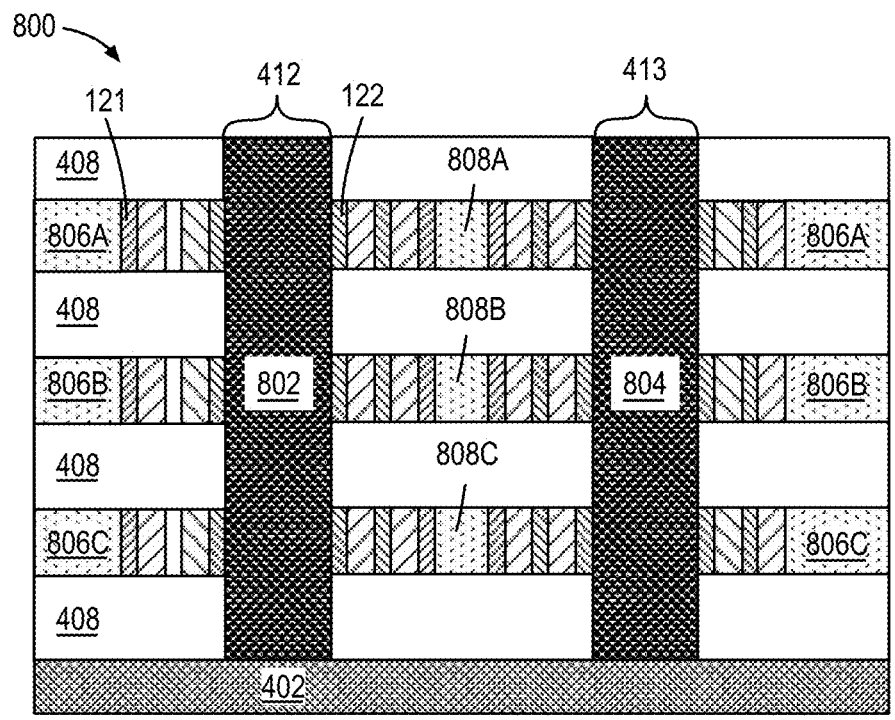
FIG. 8B illustrates the structure of FIG. 8A following the formation of a first set of conductors and a second set of conductors in three levels of memory array.

FIG. 8B illustrates the structure of FIG. 8A following the formation of conductors 806A, 806B and 806C, and conductors 808A, 808B and 808C in the three levels of memory array. In an embodiment, the dielectric 406A is removed from the structure of FIG. 8A. In an embodiment, a wet chemical process is utilized to remove the dielectric 406A adjacent to dielectric 408 and terminal 122 and form openings between alternative layers of dielectric 408. An electrode material is then deposited to fill into the openings formed by removal of the dielectric 406A.

In an embodiment, the dielectric 406B is removed from the structure of FIG. 8A. In an embodiment, a wet chemical process is utilized to remove the dielectric 406B adjacent to dielectric 408 and terminal 122 and form openings between alternative layers of dielectric 408. An electrode material is then deposited to fill into the openings formed by removal of the dielectric 406B. Dielectric 406B may be removed concurrently with dielectric 406A.

In an embodiment, dielectric portions 406A and 406B may be removed at the same time and a same electrode material may be utilized to form conductors 806A, 806B and 806C and conductors 808A, 808B and 808C.

Figure 9:
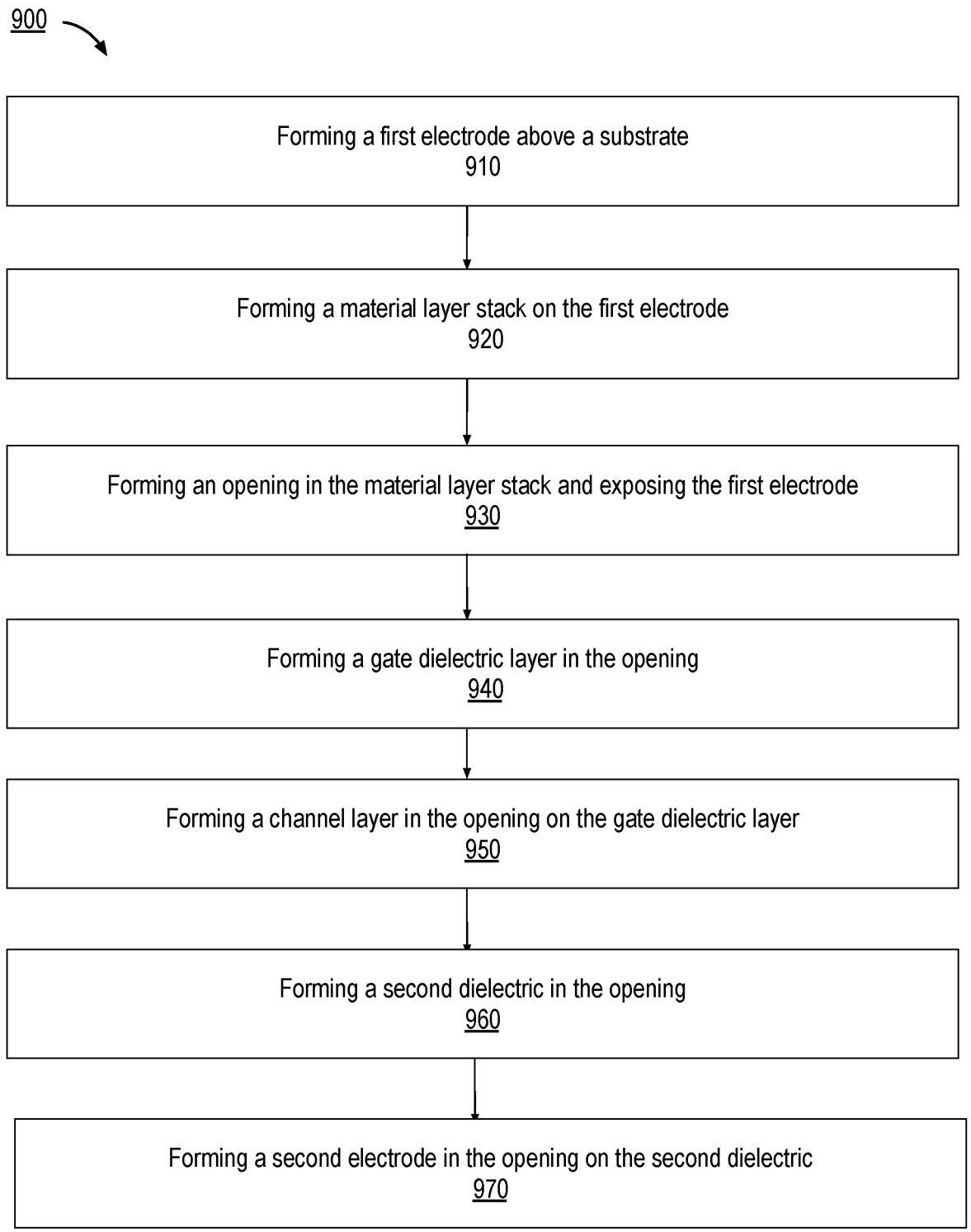
FIG. 9 is a method to fabricate a transistor described in association with FIGS. 1A-1B, in accordance with an embodiment of the present disclosure.

FIG. 9 is a method 900 to fabricate a transistor described in association with FIG. 1A, in accordance with an embodiment of the present disclosure. The method 900 begins at operation 910 with the formation of a forming a first electrode structure above a substrate. The method 900 continues at operation 920 with the formation of a material layer stack including a gate electrode material on a first dielectric above the first electrode, followed by depositing a second dielectric on the gate electrode material. The method 900 continues at operation 930 with the formation of an opening in the material layer stack and exposing the first electrode. The method 900 continues at operation 940 with the formation of a gate dielectric layer in the opening. The method 900 continues at operation 950 with the formation of a channel layer in the opening on the gate dielectric layer. The method 900 continues at operation 960 with the formation of a second dielectric in the opening, wherein the dielectric partially fills the opening. The method 900 concludes at operation 970 with the formation of a second electrode in the opening.

Figure 10A:
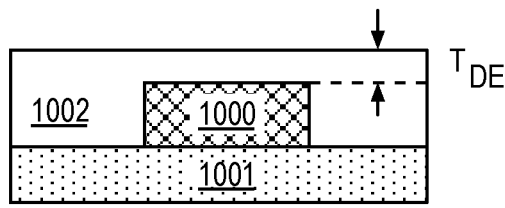
FIG. 10A is a cross-sectional illustration of an electrode formed above a substrate.

FIG. 10A is a cross-sectional illustration of an electrode 1000 formed above a substrate 1001. In an embodiment, an electrode material is blanket deposited on the substrate and patterned. A lithographic mask may be formed on the electrode material. In an embodiment, a plasma etch process is utilized to etch the electrode material to form electrode 1000.

The fabrication process is continued with blanket deposition of a dielectric 1002 on the electrode 1000. In an embodiment, a chemical mechanical polish (CMP) process is utilized to planarize the dielectric 1002. The dielectric 1002 may be then recessed to a level at or above the uppermost surface 1000A of the electrode 1000 as shown. In an embodiment, a finite dielectric 1002 thickness above the electrode 1000 prevents a gate electrode from shorting with electrode 1000. In an embodiment, substrate 1001 includes a material such as single crystal silicon, polycrystalline silicon and silicon on insulator (SOI), as well as substrates formed of other semiconductor materials such as group III-V materials. In an exemplary embodiment, substrate 1001 includes silicon and at least one of oxygen, nitrogen or carbon.

Figure 10B:
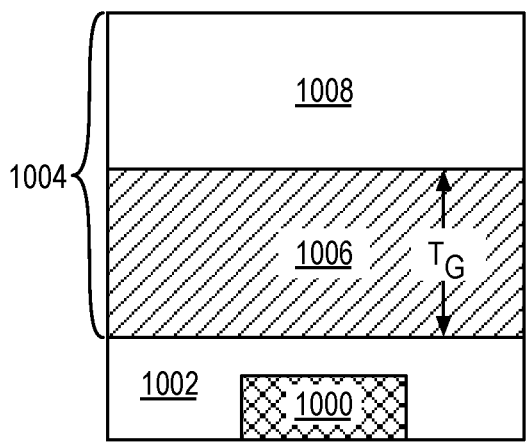
FIG. 10B illustrates the structure of FIG. 10C following the process to form a material layer stack on a first dielectric above the electrode.
Figure 10C:
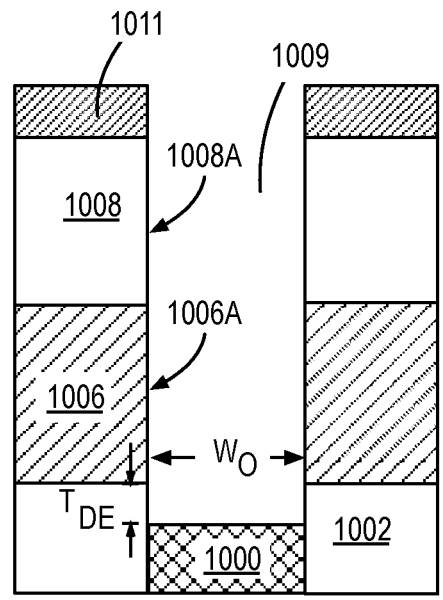
FIG. 10C illustrates the structure of FIG. 10C following the formation of an opening in the material layer stack.

FIG. 10B illustrates the structure of FIG. 10C following the process to form a material layer stack 1004 on the dielectric 1002. In an embodiment, process involves blanket depositing a gate electrode material 1006 on the dielectric 1002. A blanket deposition process may utilize a PECVD (plasma enhanced chemical vapor deposition), a physical vapor deposition (PVD), or a chemical vapor deposition (CVD) technique. In embodiments, the gate electrode material 1006 includes a material that is the same or substantially the same as the material of the gate electrode 110 described above. In an embodiment, the gate electrode material is deposited to a thickness, $T_G$, that will determine a maximum gate length of a pillar transistor to be formed. In embodiments thickness, $T_G$, is between 30 nm and 200 nm.

The deposition process is continued with the formation of a dielectric 1008 on the gate electrode material 1006. In an embodiment, the dielectric 1008 includes a material that is the same or substantially the same as the material of the dielectric 1002.

FIG. 10C illustrates the structure of FIG. 10C following the formation of an opening 1009 in the material layer stack 1004. In an embodiment, a mask 1011 is formed on the dielectric 1008. In an embodiment, mask 1011 includes a photoresist material. In an embodiment, a plasma etch process is utilized to pattern material layer stack 1004 to form an opening 1009. In an embodiment, the plasma etch process forms an opening in the dielectric 1008. In an exemplary embodiment, a second etch process with etchants that are selective to dielectric 1008 is utilized to continue to etch gate electrode material 1006 to form opening 1009. The etch process forms sidewalls 1006A in the gate electrode material 1006 that are substantially coplanar with sidewalls 1008A formed in the dielectric 1008. The etch process is continued until a portion of the dielectric 1002 is etched to expose the underlying electrode 1000. In some embodiments, the thickness, $T_{DE}$, of the dielectric 1002 above the electrode 1000 is between 1 nm and 3 nm and determined during formation of the material layer stack 1004.

In an embodiment, the opening 1009 has a lateral thickness, Wo, along a length of the gate electrode material 1006. In embodiments, Wo, is determined by a memory cell size to be fabricated once a transistor is formed. Wo may be also determined by a lateral thickness of the electrode 1000, minimum thicknesses of a gate dielectric layer and a channel layer to be formed.

Figure 10D:
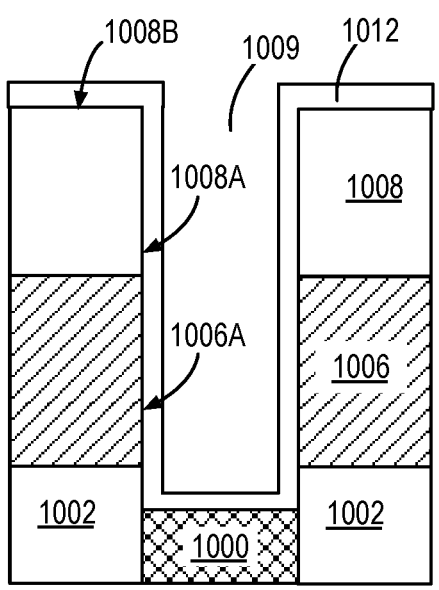
FIG. 10D illustrates the structure of FIG. 10C following the formation of a gate dielectric layer in the opening.

FIG. 10D illustrates the structure of FIG. 10C following the formation of a gate dielectric layer 1012 in the opening 1009. In an embodiment, the gate dielectric layer 1012 is deposited by an atomic layer deposition process. The ALD process may form a substantially conformal layer of gate dielectric layer 1012 on sidewalls 1006A and 1008A. In the illustrative embodiment, the gate dielectric layer 1012 is also deposited on the electrode 1000 and on uppermost surface 1008B of the dielectric 1008.

Figure 10E:
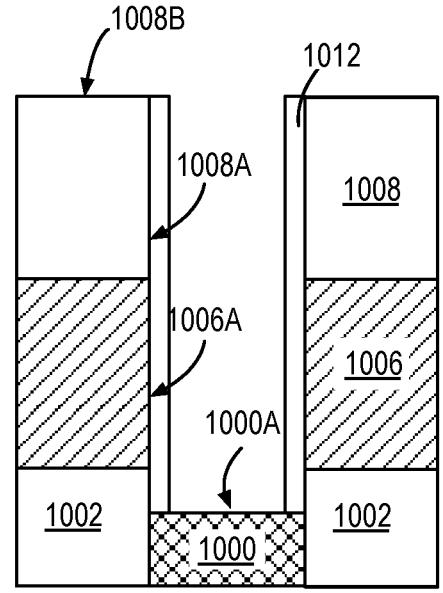
FIG. 10E illustrates the structure of FIG. 10D following the process to etch and remove portions of the gate dielectric layer from above the electrode.
Figure 10F:
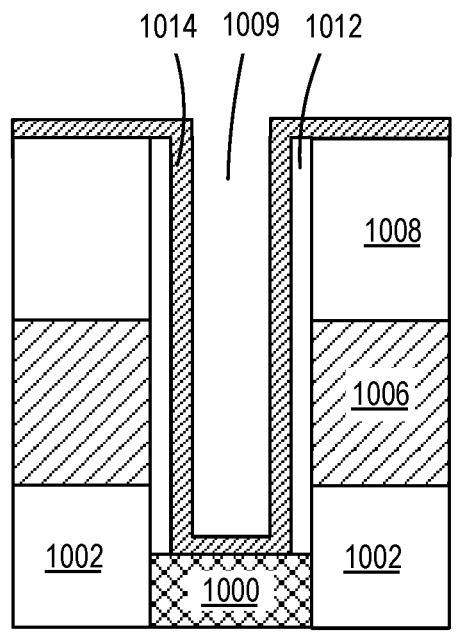
FIG. 10F illustrates the structure of FIG. 10E following the formation of a material for channel layer in the opening on the electrode, and on the gate dielectric layer.

FIG. 10E illustrates the structure of FIG. 10F following the process to etch and remove portions of the gate dielectric layer 1012 from above the electrode 1000. In an embodiment, a plasma etch process that is anisotropic is utilized to etch and remove the gate dielectric layer 1012 from electrode surface 1000A and from above dielectric surface 1008A but not from sidewalls 1006A and 1008A.

FIG. 10F illustrates the structure of FIG. 10E following the formation of a channel layer 1014 in the opening 1009 on the electrode 1000, adjacent to the gate dielectric layer 1012 and on the dielectric 1008. In an embodiment, a PVD, PECVD, CVD or an ALD process may be utilized to deposit the channel layer. In an embodiment, the channel layer 1014 is deposited to a thickness between 5 nm and 20 nm.

Figure 10G:
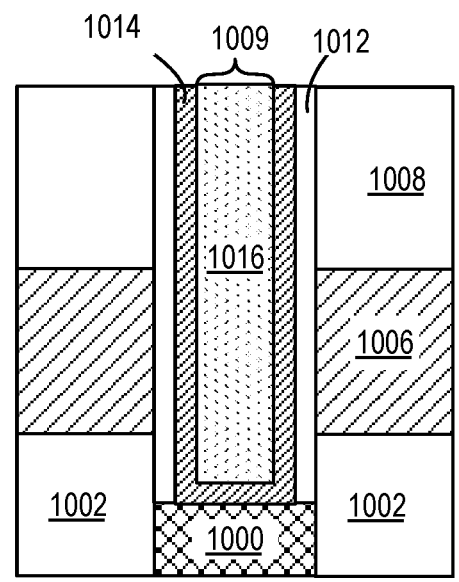
FIG. 10G illustrates the structure of FIG. 10F following the formation of a second dielectric in the opening.

FIG. 10G illustrates the structure of FIG. 10F following the formation of a dielectric 1016 in the opening 1009. In an embodiment, the dielectric 1016 includes a material that is different from the dielectric 1008. In an embodiment, the dielectric 1008 includes silicon, nitrogen and one or more of oxygen or carbon and the dielectric 1016 includes silicon and oxygen. In an embodiment, dielectric 1016 is deposited in a manner that is substantially the same as a deposition process utilized to form dielectric 1008. In an embodiment, the dielectric 1016 is deposited in the opening 1009, adjacent channel layer 1014 and on a top portion of gate dielectric layer 1012.

After the deposition process, the dielectric 1016 is planarized. In an embodiment, the planarization process includes a CMP process.

Figure 10H:
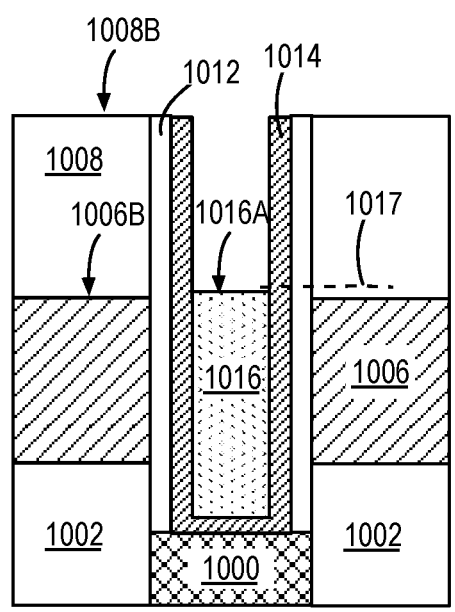
FIG. 10H illustrates the structure of FIG. 10G following the process to selectively recess the second dielectric with respect to the gate dielectric layer and channel layer.

FIG. 10H illustrates the structure of FIG. 10G following the process to selectively recess dielectric 1016 with respect to dielectric 1008, gate dielectric layer 1012 and channel layer 1014. In an exemplary embodiment, the dielectric 1016 is recessed by a wet etch process below an uppermost surface 1008B. In an embodiment, the dielectric 1016 may be recessed to a level of an uppermost surface 1006B of the gate electrode material 1006.

In an embodiment, the channel layer 1014 and the gate dielectric layer 1012 are both recessed below the uppermost surface 1008B but to a level above the uppermost surface 1006B, as indicated by dashed lines 1017. In an embodiment, the channel layer 1014 and the gate dielectric layer 1012 are recessed (indicated by dashed lines 1017) below the uppermost surface 1008B to a level of an uppermost surface 1016A of the dielectric 1016, where the uppermost surface 1016A is above surface 1006B.

Figure 10I:
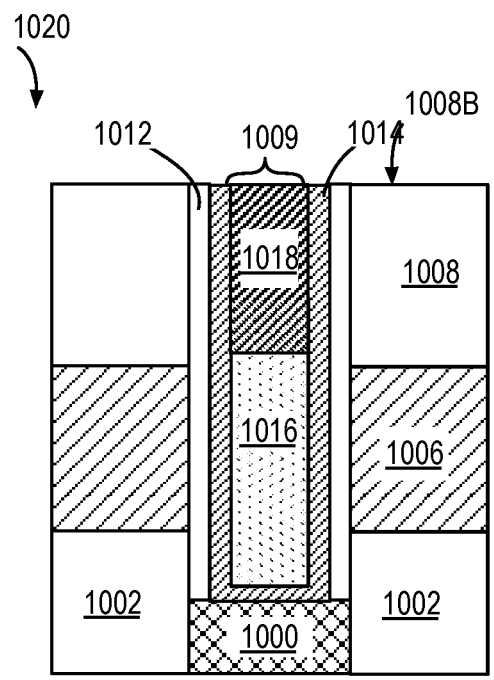
FIG. 10I illustrates the structure of FIG. 10H following the formation of a top electrode.

FIG. 10I illustrates the structure of FIG. 10H following the formation of electrode 1018. In an embodiment, an electrode material is blanket deposited into the opening 1009. In an embodiment, the electrode material is blanket deposited using a PVD, CVD, PECVD or an ALD process. In the illustrative embodiment, the electrode material is deposited on the dielectric 1016, adjacent to channel layer 1014, on uppermost portions of the gate dielectric layer 1012 and on dielectric surface 1008B. After deposition, the electrode material may be planarized by a CMP process to form drain structure 1018 and complete formation of pillar select transistor 1020, as shown.

Figures 11, 12A:
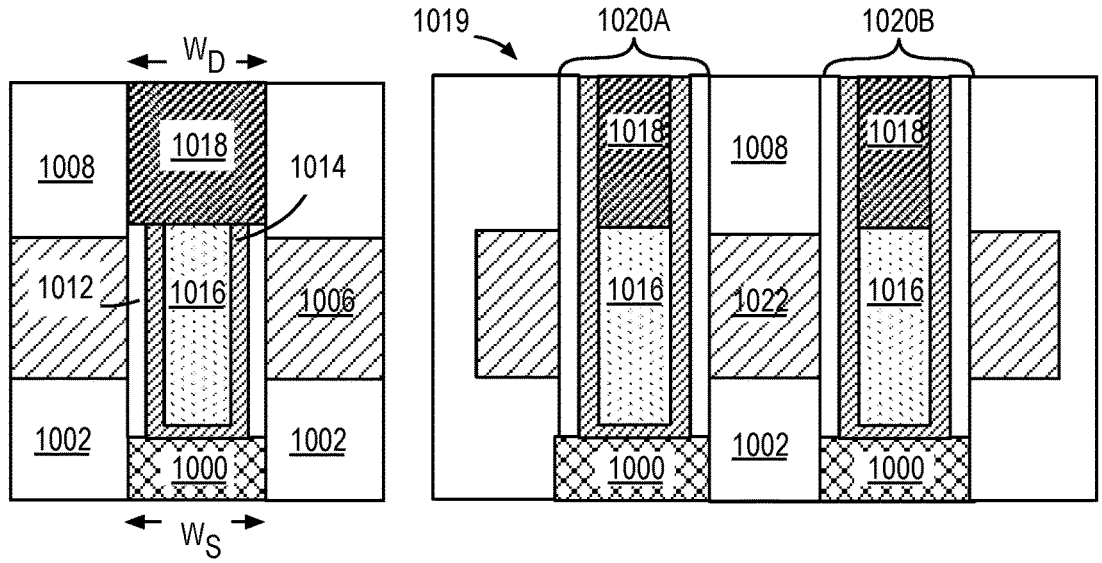
FIG. 11 is a cross-sectional illustration of a transistor structure where the source structure and drain structure each have a same lateral thickness.
FIG. 12A is a cross-sectional illustration of an array of transistors.

In an embodiment, the drain structure 1018 is adjacent to the channel layer 1014 as well as the gate dielectric layer 1012 as shown in FIG. 11. In some such embodiments, the drain structure 1018 has a lateral thickness, $W_D$, that is the same or substantially the same as the lateral thickness, $W_S$ of the source structure 1000.

While fabrication process described in association with FIG. 10A-10I illustrate a method to form a single transistor, an array of transistors may be formed by forming a plurality of openings such as opening 1009 in the material layer stack 1004 as illustrated in FIG. 10C.

FIG. 12A is a cross-sectional illustration of a transistor array 1019 including transistors 1020A and 1020B. Transistors 1020A and 1020B have one or more features of the pillar select transistor 1020 illustrated in FIG. 10I. In the illustrative embodiment, gate electrode material 1006 is shared between pillar select transistor 1020A and 1020B and is a feature of the fabrication process described above. In an embodiment, edge portions of the gate electrode material be etched to form a shared gate electrode 1022, such as is shown. Lateral spacing between respective electrodes 1000 of each pillar select transistor 1020A and 1020B may depend on the cell spacing, lateral thickness of each memory cell and on a thickness of the gate electrode into the plane of the figure (for e.g., along z-axis).

Figure 12B:
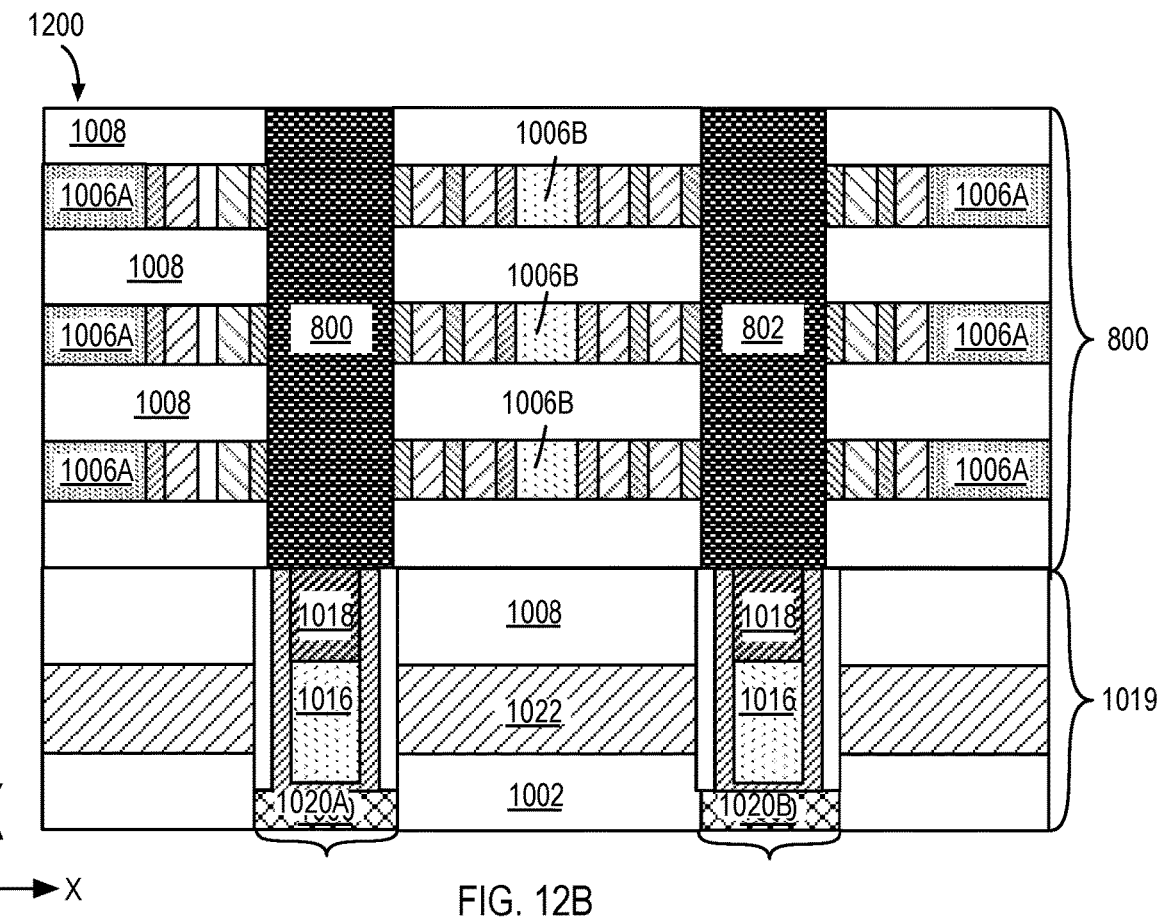
FIG. 12B is a cross-sectional illustration of a tiered memory array on a logic transistor array, in accordance with an embodiment of the present disclosure.

FIG. 12B is a cross-sectional illustration of a multi-tiered memory array such as the multi-tiered memory array 800 formed above the transistor array 1019 including a pair of transistors 1020A and 1020B, in accordance with an embodiment of the present disclosure to form a memory device structure 1200. Memory device structure 1200 may be formed by a combination of process operations described in association with FIGS. 4A-8B and FIGS. 10A-10I. One or more routing structures may be formed adjacent to gate electrode 1022 and electrode 1000 to facilitate operation of transistors 1020A and 1020B.

Figure 13:
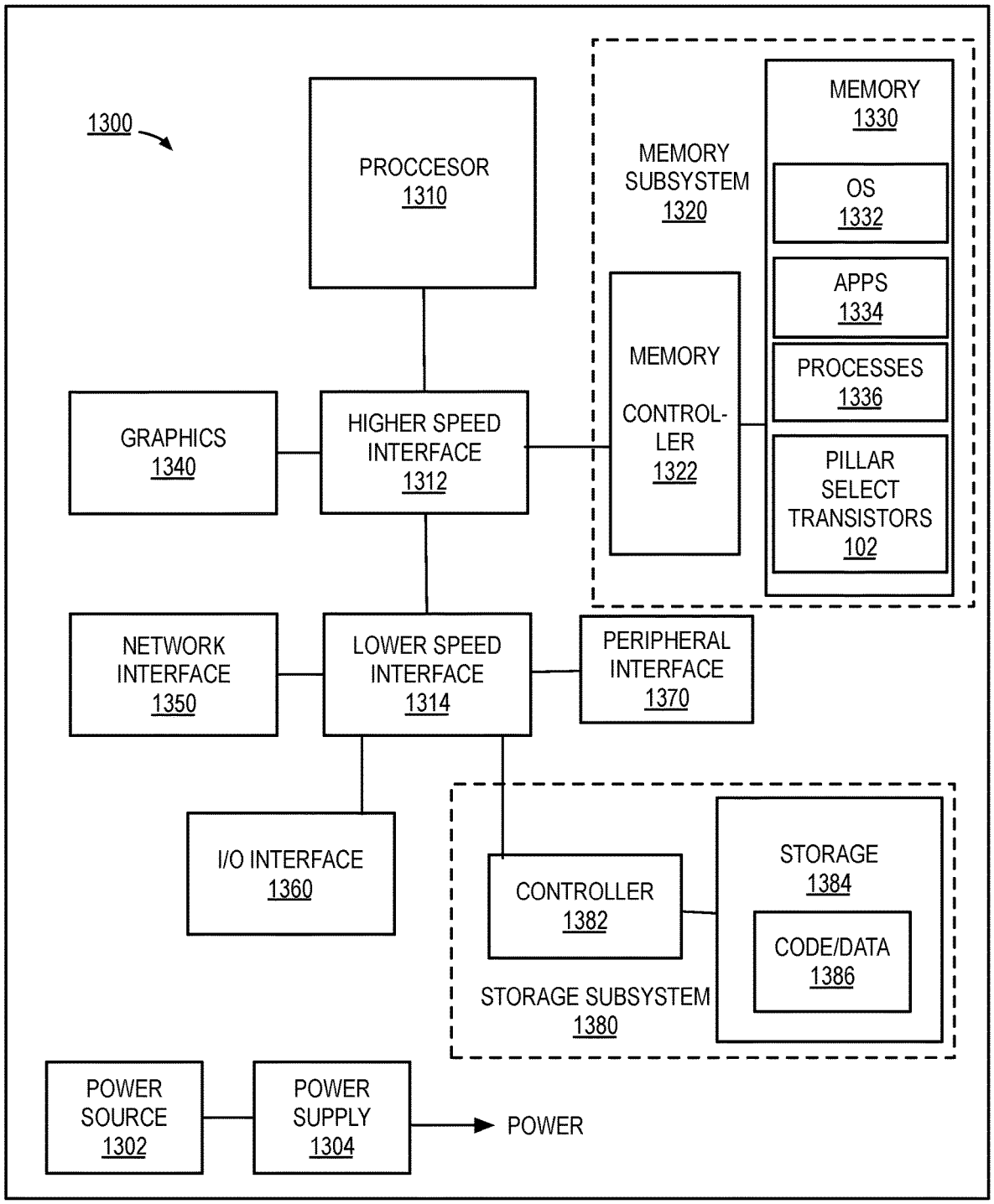
FIG. 13 is a block diagram of an example of a computing system that includes a pillar select transistor array coupled with a memory device array to enable decoder transistor footprint scaling.

FIG. 13 is a block diagram of an example of a computing system that includes a pillar select transistor array coupled with a memory device array to enable decoder transistor footprint scaling. System 1300 represents a computing device in accordance with any example herein, and can be a laptop computer, a desktop computer, a tablet computer, a server, a gaming or entertainment control system, embedded computing device, or other electronic device.

System 1300 includes a memory array in memory 1330, which can be a memory array in accordance with an example of memory device structure 300 of FIG. 3A. In one example, pillar select transistors 1390 represent pillar select transistors in accordance with any example provided herein. The pillar select transistors enable memory 1330 to provide selection of a target cell within the memory array. The use of the described pillar select transistors enables selection with lower energy usage as compared to traditional decoder transistors.

System 1300 includes processor 1310. In embodiments, processor 1310 can include any type of microprocessor, central processing unit (CPU), graphics processing unit (GPU), processing core, or other processing hardware, for a combination, to provide processing or execution of instructions for system 1300. Processor 1310 controls the overall operation of system 1300, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 1300 includes interface 1312 coupled to processor 1310, which can represent a higher speed interface or a high throughput interface for system components that need higher bandwidth connections, such as memory subsystem 1320 or graphics interface components 1340. Interface 1312 represents an interface circuit. In embodiments interface 1312, can be a standalone component or integrated onto a processor die. Interface 1312 can be integrated as a circuit onto the processor die or integrated as a component on a chip. Where present, graphics interface 1340 interfaces to graphics components for providing a visual display to a user of system 1300. Graphics interface 1340 can be a standalone component or integrated onto the processor die or system on a chip. In one example, graphics interface 1340 can drive a high definition (HD) display that provides an output to a user. In one example, the display can include a touchscreen display. In one example, graphics interface 1340 generates a display based on data stored in memory 1330 or based on operations executed by processor 1310 or both.

Memory subsystem 1320 represents the main memory of system 1300 and provides storage for code to be executed by processor 1310, or data values to be used in executing a routine. Memory subsystem 1320 can include one or more memory devices 1330 such as read-only memory (ROM), flash memory, one or more varieties of random access memory (RAM) such as DRAM or other memory devices, or a combination of such devices. In some embodiments memory subsystem 1320 includes persistent memory (PMem) which may offer higher RAM capacity than traditional DRAM. 3D-cross point is an example of persistent memory. 3D-cross point is a byte-addressable write-in-place 3D-crosspoint non-volatile memory device. PMem may operate in a persistent mode, i.e., utilizing non-volatile memory (NVM) devices integrated with selectors in a tier architecture, to store data without power applied to the memory subsystem 1320 for non-volatile data storage. An NVM device is a memory whose state is determinate even if power is interrupted to the device. A NVM device can also include a byte-addressable write-in-place three dimensional cross point memory device, or other byte addressable write-in-place NVM devices (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CBRAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. In other embodiments, memory subsystem 1320 includes solid state drives (SSDs) including 3D cross point memory residing in a NAND package for fast storage. or dual in line Memory Module (DIMM) in a circuit that includes one or more 3D cross point memory devices.

Memory 1330 stores and hosts operating system (OS) 1332 to provide a software platform for execution of instructions in system 1300. Additionally, applications 1334 can execute on the software platform of OS 1332 from memory 1330. Applications 1334 represent programs that have their own operational logic to perform execution of one or more functions. Processes 1336 represent agents or routines that provide auxiliary functions to OS 1332 or one or more applications 1334 or a combination. OS 1332, applications 1334, and processes 1336 provide software logic to provide functions for system 1300. In one example, memory subsystem 1320 includes memory controller 1322, which is a memory controller to generate and issue commands to memory 1330. It will be understood that memory controller 1322 could be a physical part of processor 1310 or a physical part of interface 1312. For example, memory controller 1322 can be an integrated memory controller, integrated onto a circuit with processor 1310, such as integrated onto the processor die or a system on a chip.

While not specifically illustrated, it will be understood that system 1300 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 1300 includes interface 1314, which can be coupled to interface 1312. Interface 1314 can be a lower speed interface than interface 1312. In one example, interface 1314 represents an interface circuit, which can include standalone components and integrated circuitry. In one example, multiple user interface components or peripheral components, or both, couple to interface 1314. Network interface 1350 provides system 1300 the ability to communicate with remote devices (e.g., servers or other computing devices) over one or more networks. Network interface 1350 can include an Ethernet adapter, wireless interconnection components, cellular network interconnection components, USB (universal serial bus), or other wired or wireless standards-based or proprietary interfaces. Network interface 1350 can exchange data with a remote device, which can include sending data stored in memory or receiving data to be stored in memory.

In one example, system 1300 includes one or more input/output (I/O) interface(s) 1360. I/O interface 1360 can include one or more interface components through which a user interacts with system 1300 (e.g., audio, alphanumeric, tactile/touch, or other interfacing). Peripheral interface 1370 can include any hardware interface not specifically mentioned above. Peripherals refer generally to devices that connect dependently to system 1300. A dependent connection is one where system 1300 provides the software platform or hardware platform or both on which operation executes, and with which a user interacts.

In one example, system 1300 includes storage subsystem 1380 to store data in a nonvolatile manner In one example, in certain system implementations, at least certain components of storage 1380 can overlap with components of memory subsystem 1320. Storage subsystem 1380 includes storage device(s) 1384, which can be or include any conventional medium for storing large amounts of data in a nonvolatile manner, such as one or more magnetic, solid state that include 3D cross point memory, or optical based disks, or a combination. Storage 1384 holds code or instructions and data 1386 in a persistent state (i.e., the value is retained despite interruption of power to system 1300). Storage 1384 can be generically considered to be a "memory," although memory 1330 is typically the executing or operating memory to provide instructions to processor 1310. Whereas storage 1384 is nonvolatile, memory 1330 can include volatile memory (i.e., the value or state of the data is indeterminate if power is interrupted to system 1300). In one example, storage subsystem 1380 includes controller 1382 to interface with storage 1384. In one example controller 1382 is a physical part of interface 1314 or processor 1310 or can include circuits or logic in both processor 1310 and interface 1314.

Power source 1302 provides power to the components of system 1300. More specifically, power source 1302 typically interfaces to one or multiple power supplies 1304 in system 1300 to provide power to the components of system 1300. In one example, power supply 1304 includes an AC to DC (alternating current to direct current) adapter to plug into a wall outlet. Such AC power can be renewable energy (e.g., solar power) power source 1302. In one example, power source 1302 includes a DC power source, such as an external AC to DC converter. In one example, power source 1302 or power supply 1304 includes wireless charging hardware to charge via proximity to a charging field. In one example, power source 1302 can include an internal battery or fuel cell source.

Figure 14:
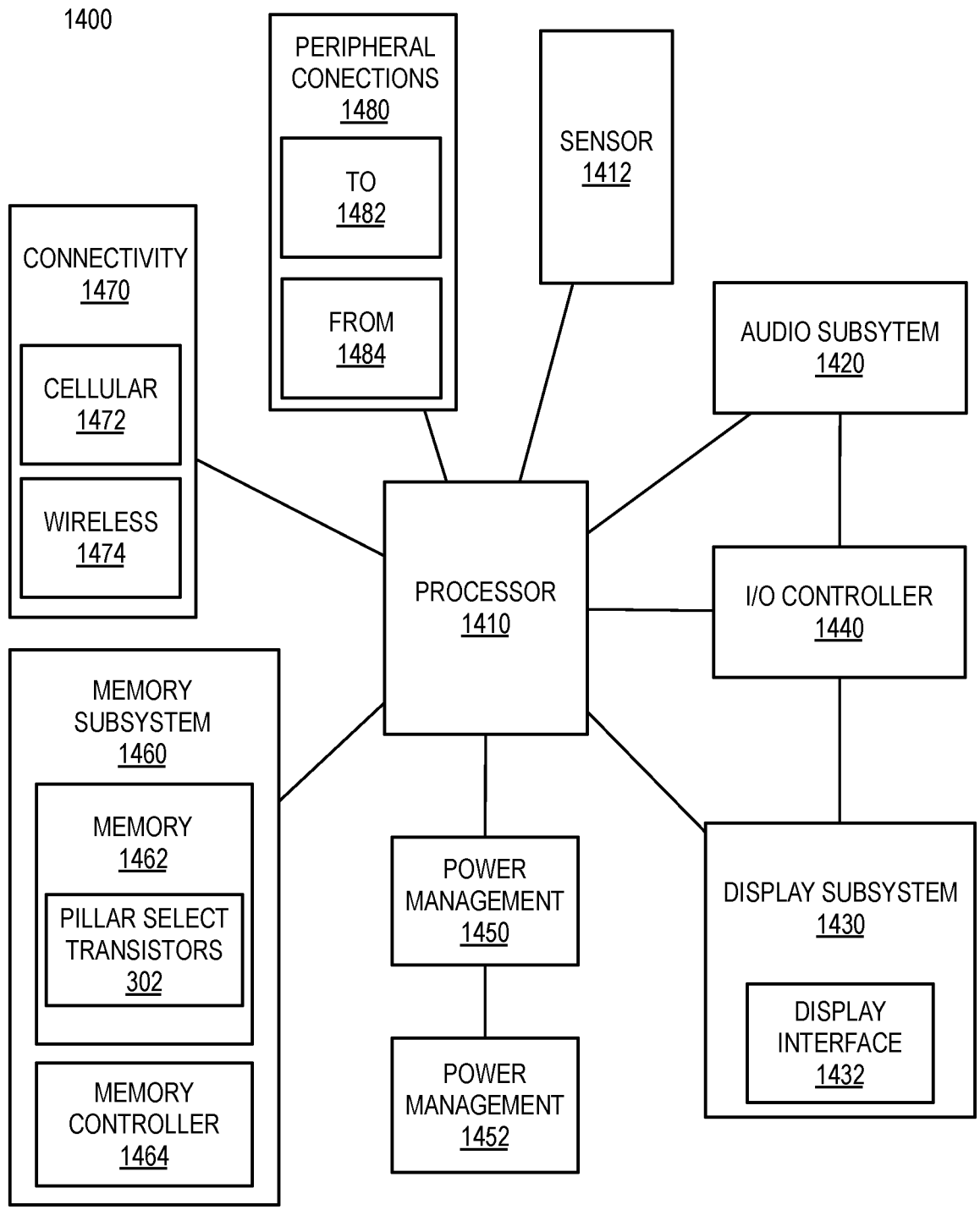
FIG. 14 is a block diagram of an example of a system, where a memory that includes pillar select transistor array coupled with a memory device array to enable decoder transistor footprint scaling.

FIG. 14 is a block diagram of an example of a system 1400 that includes a pillar select transistor array coupled with a memory device array to enable decoder transistor footprint scaling. System 1400 represents a mobile computing device, such as a computing tablet, a mobile phone or smartphone, wearable computing device, or other mobile device, or an embedded computing device.

System 1400 includes a memory array in memory 1462, which can be a memory array in accordance with an example of memory device structure 300 of FIG. 3. In one example, pillar select transistors 1490 represent pillar select transistors in accordance with any example provided herein. The pillar select transistors enable memory 1462 to provide selection of a target cell within the memory array. The use of the described pillar select transistors enables selection with lower energy usage as compared to traditional decoder transistors.

System 1400 includes processor 1410, which performs the primary processing operations of system 1400. Processor 1410 can include one or more physical devices, such as microprocessors, application processors, microcontrollers, programmable logic devices, or other processing means. The processing operations performed by processor 1410 include the execution of an operating platform or operating system on which applications and device functions are executed. The processing operations include operations related to I/O (input/output) with a human user or with other devices, operations related to power management, operations related to connecting system 1400 to another device, or a combination. The processing operations can also include operations related to audio I/O, display I/O, or other interfacing, or a combination. Processor 1410 can execute data stored in memory. Processor 1410 can write or edit data stored in memory.

In one example, system 1400 includes one or more sensors 1412. Sensors 1412 represent embedded sensors or interfaces to external sensors, or a combination. Sensors 1412 enable system 1400 to monitor or detect one or more conditions of an environment or a device in which system 1400 is implemented. Sensors 1412 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1412 can also include sensors for biometric systems such as fingerprint recognition systems, face detection or recognition systems, or other systems that detect or recognize user features. Sensors 1412 should be understood broadly, and not limiting on the many different types of sensors that could be implemented with system 1400. In one example, one or more sensors 1412 couples to processor 1410 via a frontend circuit integrated with processor 1410. In one example, one or more sensors 1412 couples to processor 1410 via another component of system 1400.

In one example, system 1400 includes audio subsystem 1420, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 1400 or connected to system 1400. In one example, a user interacts with system 1400 by providing audio commands that are received and processed by processor 1410.

Display subsystem 1430 represents hardware (e.g., display devices) and software components (e.g., drivers) that provide a visual display for presentation to a user. In one example, the display includes tactile components or touchscreen elements for a user to interact with the computing device. Display subsystem 1430 includes display interface 1432, which includes the particular screen or hardware device used to provide a display to a user. In one example, display interface 1432 includes logic separate from processor 1410 (such as a graphics processor) to perform at least some processing related to the display. In one example, display subsystem 1430 includes a touchscreen device that provides both output and input to a user. In one example, display subsystem 1430 includes a high definition (HD) or ultra-high definition (UHD) display that provides an output to a user. In one example, display subsystem includes or drives a touchscreen display. In one example, display subsystem 1430 generates display information based on data stored in memory or based on operations executed by processor 1410 or both.

I/O controller 1440 represents hardware devices and software components related to interaction with a user. I/O controller 1440 can operate to manage hardware that is part of audio subsystem 1420, or display subsystem 1430, or both. Additionally, I/O controller 1440 illustrates a connection point for additional devices that connect to system 1400 through which a user might interact with the system. For example, devices that can be attached to system 1400 might include microphone devices, speaker or stereo systems, video systems or other display device, keyboard or keypad devices, or other I/O devices for use with specific applications such as card readers or other devices.

As mentioned above, I/O controller 1440 can interact with audio subsystem 1420 or display subsystem 1430 or both. For example, input through a microphone or other audio device can provide input or commands for one or more applications or functions of system 1400. Additionally, audio output can be provided instead of or in addition to display output. In another example, if display subsystem includes a touchscreen, the display device also acts as an input device, which can be at least partially managed by I/O controller 1440. There can also be additional buttons or switches on system 1400 to provide I/O functions managed by I/O controller 1440.

In one example, I/O controller 1440 manages devices such as accelerometers, cameras, light sensors or other environmental sensors, gyroscopes, global positioning system (GPS), or other hardware that can be included in system 1400, or sensors 1412. The input can be part of direct user interaction, as well as providing environmental input to the system to influence its operations (such as filtering for noise, adjusting displays for brightness detection, applying a flash for a camera, or other features).

In one example, system 1400 includes power management 1450 that manages battery power usage, charging of the battery, and features related to power saving operation. Power management 1450 manages power from power source 1452, which provides power to the components of system 1400. In one example, power source 1452 includes an AC to DC (alternating current to direct current) adapter to plug into a wall outlet. Such AC power can be renewable energy (e.g., solar power, motion based power). In one example, power source 1452 includes only DC power, which can be provided by a DC power source, such as an external AC to DC converter. In one example, power source 1452 includes wireless charging hardware to charge via proximity to a charging field. In one example, power source 1452 can include an internal battery or fuel cell source.

Memory subsystem 1460 includes memory device(s) 1462 for storing information in system 1400. Memory subsystem 1460 can include nonvolatile (state does not change if power to the memory device is interrupted) or volatile (state is indeterminate if power to the memory device is interrupted) memory devices, or a combination. Memory 1460 can store application data, user data, music, photos, documents, or other data, as well as system data (whether long-term or temporary) related to the execution of the applications and functions of system 1400. In one example, memory subsystem 1460 includes memory controller 1464 (which could also be considered part of the control of system 1400 and could potentially be considered part of processor 1410). Memory controller 1464 includes a scheduler to generate and issue commands to control access to memory device 1462.

Connectivity 1470 includes hardware devices (e.g., wireless or wired connectors and communication hardware, or a combination of wired and wireless hardware) and software components (e.g., drivers, protocol stacks) to enable system 1400 to communicate with external devices. The external device could be separate devices, such as other computing devices, wireless access points or base stations, as well as peripherals such as headsets, printers, or other devices. In one example, system 1400 exchanges data with an external device for storage in memory or for display on a display device. The exchanged data can include data to be stored in memory, or data already stored in memory, to read, write, or edit data.

Connectivity 1470 can include multiple different types of connectivity. To generalize, system 1400 is illustrated with cellular connectivity 1472 and wireless connectivity 1474. Cellular connectivity 1472 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1474 refers to wireless connectivity that is not cellular and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1480 include hardware interfaces and connectors, as well as software components (e.g., drivers, protocol stacks) to make peripheral connections. It will be understood that system 1400 could both be a peripheral device ("to" 1482) to other computing devices, as well as have peripheral devices ("from" 1484) connected to it. System 1400 commonly has a "docking" connector to connect to other computing devices for purposes such as managing (e.g., downloading, uploading, changing, synchronizing) content on system 1400. Additionally, a docking connector can allow system 1400 to connect to certain peripherals that allow system 1400 to control content output, for example, to audiovisual or other systems.

In addition to a proprietary docking connector or other proprietary connection hardware, system 1400 can make peripheral connections 1480 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In a first example, a memory device structure includes a vertical pillar select transistor coupled with a pair of memory cells through a vertical interconnect structure. The transistor includes a channel between a source and a drain, where the channel is along a longitudinal axis of the transistor. The transistor further includes a gate electrode adjacent the channel, where the gate electrode is in a first direction orthogonal to longitudinal axis. A gate dielectric layer is between the gate electrode and the channel. The memory device structure further includes a first interconnect, where a first terminal of the first interconnect is coupled with the source or the drain, and where the first interconnect is colinear with the longitudinal axis. A pair of second interconnects is along a second direction orthogonal to the first direction and the longitudinal axis. The memory device structure further includes a pair of memory cells, where individual ones of the memory cells comprises a selector and a memory element, wherein a first terminal of the individual ones of the memory cell is coupled to a respective second and a third terminal of the first interconnect and wherein a second terminal of the individual ones of the memory cell is coupled to individual ones of the pair of second interconnects.

In second examples, for any of first examples, further includes a second pair of memory cells above the first pair, where the individual ones of the second pair of memory cells includes a selector and a memory element, where a first terminal of the individual ones of second pair of memory cells is coupled to a respective fourth and a fifth terminal of the first interconnect and where a second terminal of the individual ones of the second pair of memory cells is coupled to individual ones of a pair of third interconnects, where the pair of third interconnects parallel to and above the pair of second interconnects.

In third examples, for any of the first through second examples, the memory element is coupled with the first terminal and the selector element is coupled with the second terminal.

In fourth examples, for any of the first through third examples, the memory element is coupled with to the second terminal and the selector element is coupled with the third terminal.

In fifth examples, for any of the first through fourth examples the transistor channel includes a polycrystalline or amorphous material.

In sixth examples, for any of the first through fifth examples, the polycrystalline or amorphous material includes $In_2O_3$, $Ga_2O_3$, ZnO, InGaZnO, InZnO, InGaO, GaZnO, InAlO, InSnO, InMgO, GaZnMgO, GaZnSnO, GaAlZnO, GaAlSnO, HfZnO, HfInZnO, HfAlGaZnO, InMgZnO, NbO, NiO, CoO, SnO, $Cu_2O$, AgAlO, $CuAlO_3$, AlScOC, $Sr_3BPO_3$, $La_2SiO_4Se$, LaCuSe, $Rb_2Sn_2O_3$, $La_2O_2S_2$, $K_2Sn_2O_3$, $Na_2FeOSe_2$, $ZnRh_2O_4$ or $CuO_x$, where x is 1 or 2.

In seventh examples, for any of the first through sixth examples, the channel surrounds a core including a dielectric material in the first and in the second directions, and where the gate dielectric layer surrounds channel layer in the first and in the second directions and where the gate electrode surrounds the gate dielectric layer in the first and in the second directions.

In eighth examples, for any of the first through seventh examples, the drain structure is above the source structure, where the gate electrode is substantially equidistant between a lowermost surface of the drain structure and an uppermost surface of the source electrode.

In ninth examples, for any of the first through eighth examples, the gate electrode is at least 1 nm above an uppermost surface of the source electrode.

In tenth examples, for any of the first through eighth examples, the transistor is an array of transistors along the first direction, where the gate electrode of each transistor in the array of transistors are coupled in electrical parallel.

In eleventh examples, for any of the first through tenth examples, individual ones of the memory cells have a first lateral thickness along the first direction, where the first lateral thickness is between 100 nm and 120 nm.

In twelfth examples, for any of the first through eleventh examples, the source or the drain has a second lateral thickness along the first direction, where the second lateral thickness is less than two times the first lateral thickness.

In thirteenth examples, for any of the first through twelfth examples, the first interconnect has a second lateral thickness along the first direction, where the second lateral thickness is between 50 nm and 70 nm, where individual ones of the pair of second interconnects has a third lateral thickness and where the third lateral thickness is between 35 nm and 50 nm.

In a fourteenth example, a method of fabricating a vertical transistor, includes forming a first electrode structure above a substrate. The method further includes forming a material layer stack on the first electrode material layer, where forming the material layer stack includes depositing a gate electrode material on a first dielectric above the first electrode, and depositing a second dielectric on the gate electrode material. The method further includes forming an opening in the material layer stack and exposing the first electrode and forming a gate dielectric layer in the opening adjacent the gate electrode material. The method further includes forming a channel layer in the opening on the gate dielectric layer, forming a second dielectric in the opening, where the dielectric partially fills the opening and forming a second electrode in the opening.

In fifteenth examples, for any of the fourteenth through fourteenth examples, forming the first electrode includes patterning a first electrode material above a substrate and forming a dielectric material on the first electrode and planarizing the dielectric material.

In sixteenth examples, for any of the fourteenth through fifteenth examples, forming the opening includes etching the second dielectric and etching the gate electrode material to form an opening.

In seventeenth examples, for any of the fourteenth through sixteenth examples, forming the gate dielectric layer includes depositing a gate dielectric layer material in the opening and on the first electrode and etching the gate dielectric layer in contact with the first electrode to expose the first electrode.

In eighteenth examples, for any of the fourteenth through seventeenth examples, forming the second dielectric includes blanket depositing the second dielectric to fill the opening and recessing the second dielectric to a level of a top surface of the gate electrode material In nineteenth examples, a system includes a power supply and a memory device structure. The memory device structure includes a vertical pillar select transistor coupled with a pair of memory cells through a vertical interconnect structure. The transistor includes a channel between a source and a drain, where the channel is along a longitudinal axis of the transistor. The transistor further includes a gate electrode adjacent the channel, where the gate electrode is in a first direction orthogonal to longitudinal axis. A gate dielectric layer is between the gate electrode and the channel. The memory device structure further includes a first interconnect, where a first terminal of the first interconnect is coupled with the source or the drain, and where the first interconnect is colinear with the longitudinal axis. A pair of second interconnects is along a second direction orthogonal to the first direction and the longitudinal axis. The memory device structure further includes a pair of memory cells, where individual ones of the memory cells comprises a selector and a memory element, wherein a first terminal of the individual ones of the memory cell is coupled to a respective second and a third terminal of the first interconnect and wherein a second terminal of the individual ones of the memory cell is coupled to individual ones of the pair of second interconnect.

In twentieth example, for any of the nineteenth examples, the system further includes a battery and an antenna coupled with the memory device structure.

What is claimed is:

1. A memory device structure, comprising:
   a transistor, comprising:
   a channel between a source and a drain, the channel along a longitudinal axis of the transistor, the channel comprising vertical portions on opposing sidewalls of one of the source or the drain and a horizontal portion on the other of the source or the drain;
   a gate electrode along a first direction orthogonal to the longitudinal axis; and
   a gate dielectric layer between the gate electrode and the channel;
   a first interconnect coupled with the one of the source or the drain, the first interconnect colinear with the channel;
   a pair of second interconnects along a second direction orthogonal to both the longitudinal axis and the first direction; and
   a pair of memory cells, wherein individual ones of the pair of memory cells comprises a selector element and a memory element, wherein a first terminal of the individual ones of the pair of memory cells is coupled to the first interconnect and wherein a second terminal of the individual ones of the pair of memory cells is coupled to individual ones of the pair of second interconnects.

2. The memory device structure of claim 1, wherein the pair of memory cells is a first pair of memory cells within a first tier and wherein the memory device structure further comprises:
   a second pair of memory cells above the first pair of memory cells within a second tier, wherein individual ones of the second pair of memory cells comprises a selector and a memory element and wherein a first terminal of the individual ones of the second pair of memory cells is coupled to a portion of the first interconnect within the second tier; and wherein a second terminal of the individual ones of the second pair of memory cells is coupled to individual ones of a pair of third interconnects, wherein the pair of third interconnects is parallel to and above the pair of second interconnects.

3. The memory device structure of claim 2, wherein the memory element and the selector element in the first pair of memory cells and in the second pair of memory cells are connected in series, and wherein either the memory elements or the selector elements of the individual ones of the first pair of memory cells and of the second pair of memory cells are each coupled to the first interconnect.

4. The memory device structure of claim 1, wherein the channel comprises a polycrystalline or amorphous material.

5. The memory device structure of claim 4, wherein the polycrystalline or amorphous material comprises $In_2O_3$, $Ga_2O_3$, ZnO, InGaZnO, InZnO, InGaO, GaZnO, InAlO, InSnO, InMgO, GaZnMgO, GaZnSnO, GaAlZnO, GaAlSnO, HfZnO, HfInZnO, HfAlGaZnO, InMgZnO, NbO, NiO, CoO, SnO, $Cu_2O$, AgAlO, CuAlO$_2$, AlScOC, $Sr_3BPO_3$, $La_2SiO_4Se$, LaCuSe, $Rb_2Sn_2O_3$, $La_2O_2S_2$, $K_2Sn_2O_3$, $Na_2FeOSe_2$, $ZnRh_2O_4$ or $CuO_x$, where x is 1 or 2.

6. The memory device structure of claim 1, wherein the channel surrounds a core comprising a dielectric material, wherein the gate dielectric layer surrounds the channel and wherein the gate electrode surrounds the gate dielectric layer.

7. The memory device structure of claim 6, wherein the drain is above the source and the core, wherein the drain is between portions of the channel adjacent to the gate dielectric layer, wherein the source is adjacent to the gate dielectric layer and a portion of the channel extending along the first direction.

8. The memory device structure of claim 7, wherein the drain and the core each have a substantially same lateral thickness along the first direction.

9. The memory device structure of claim 6, wherein the drain is above the source, wherein the core is directly between the source and the drain, and wherein the source and the drain each have a substantially same lateral thickness along the first direction.

10. The memory device structure of claim 1, wherein the transistor is in an array of transistors along the first direction and wherein the gate electrodes of the individual ones of the transistor in the array of transistors are coupled in electrical parallel.

11. The memory device structure of claim 2, wherein the source or the drain has a first lateral thickness along the first direction, wherein the individual ones of the memory cells in the first pair of memory cells and in the second pair of memory cells each have a second lateral thickness along the first direction and wherein the first lateral thickness is less than two times the second lateral thickness.

12. The memory device structure of claim 1, wherein the first interconnect has a first lateral thickness along the first direction wherein the first lateral thickness is between 50 nm and 70 nm, wherein individual ones of the pair of second interconnects has a second lateral thickness and wherein the second lateral thickness is between 35 nm and 50 nm.

13. The memory device structure of claim 2, wherein the first interconnect has a first lateral thickness along the first direction, wherein individual ones of the memory cell in the first pair of memory cells and in the second pair of memory cells each have a second lateral thickness along the first direction, wherein the first lateral thickness is less than the second lateral thickness.

14. A system comprising:
a battery; and
a memory device structure, comprising:
a transistor, comprising:
a channel between a source and a drain, the channel along a longitudinal axis of the transistor, the channel comprising vertical portions and a horizontal portion, wherein one of the source or the drain is between the vertical portions, and the other of the source or the drain is on the horizontal portion;
a gate electrode along a first direction orthogonal to the longitudinal axis; and
a gate dielectric layer between the gate electrode and the channel;
a first interconnect coupled with the one of the source or the drain, the first interconnect colinear with the channel;
a pair of second interconnects along a second direction orthogonal to both the longitudinal axis and the first direction; and
a pair of memory cells, wherein individual ones of the pair of memory cells comprises a selector element and a memory element, wherein a first terminal of the individual ones of the pair of memory cells is coupled to the first interconnect and wherein a second terminal of the individual ones of the pair of memory cells is coupled to individual ones of the pair of second interconnects.

15. The system of claim 14, further comprising a memory controller coupled with the memory device structure.

16. An apparatus, comprising:
a transistor, comprising:
a channel between a source and a drain, the channel along a longitudinal axis of the transistor;
a gate electrode along a first direction orthogonal to the longitudinal axis; and
a gate dielectric layer between the gate electrode and the channel;
a first interconnect coupled with the source or the drain, the first interconnect colinear with the channel;
a pair of second interconnects along a second direction orthogonal to both the longitudinal axis and the first direction;
a pair of memory cells, wherein individual ones of the pair of memory cells comprises a selector element and a memory element, wherein a first terminal of the individual ones of the pair of memory cells is coupled to the first interconnect and wherein a second terminal of the individual ones of the pair of memory cells is coupled to individual ones of the pair of second interconnects; and
a pair of dielectric layers in contact with the first interconnect, a first of the dielectric layers under the second interconnects and the memory cells, and a second of the dielectric layers over the second interconnects and the memory cells.

17. The apparatus of claim 16, wherein the pair of memory cells is a first pair of memory cells within a first tier, and the apparatus further comprises:
a second pair of memory cells above the first pair of memory cells within a second tier, wherein the second of the dielectric layers is between the first and second pairs of memory cells, a third dielectric layer is over the second pair of memory cells, individual ones of the second pair of memory cells comprise a selector and a memory element, and a first terminal of the individual ones of the second pair of memory cells is coupled to a portion of the first interconnect within the second tier; and wherein a second terminal of the individual ones of the second pair of memory cells is coupled to individual ones of a pair of third interconnects, wherein the pair of third interconnects is parallel to and above the pair of second interconnects.

18. The apparatus of claim 17, wherein the memory element and the selector element in the first pair of memory cells and in the second pair of memory cells are connected in series, and wherein either the memory elements or the selector elements of the individual ones of the first pair of memory cells and of the second pair of memory cells are each coupled to the first interconnect.

19. The apparatus of claim 18, wherein each of the memory cells includes an electrode between corresponding ones of the memory elements and the selector elements, the electrode coupling the corresponding memory and selector elements.

20. The apparatus of claim 19, wherein the channel comprises first portions and a second portion, the first portions in contact with opposing sidewalls of one of the source or the drain, the second portion in contact with the other of the source or the drain.

* * * * *